United States Patent [19]
Zsamboky et al.

[11] Patent Number: 5,716,713
[45] Date of Patent: Feb. 10, 1998

[54] STACKED PLANAR TRANSFORMER

[75] Inventors: Kalman F. Zsamboky, Victor; Leon M. Balents, Honeoye Falls, both of N.Y.

[73] Assignee: Ceramic Packaging, Inc., Victor, N.Y.

[21] Appl. No.: 358,203

[22] Filed: Dec. 16, 1994

[51] Int. Cl.[6] .................................................. B32B 17/00
[52] U.S. Cl. ...................... 428/457; 428/469; 428/699; 428/701; 428/702; 336/182; 336/183; 336/232
[58] Field of Search ........................ 428/457, 469, 428/689, 699, 701, 702, 901; 427/98, 377, 372.2, 376.1, 376.2, 376.3, 376.7, 379, 383.7, 383.3; 336/182, 183, 232; 228/208, 209, 230

[56] References Cited

U.S. PATENT DOCUMENTS

| | | | |
|---|---|---|---|
| 5,010,314 | 4/1991 | Estrov | 336/198 |
| 5,058,799 | 10/1991 | Zsamboky | 228/124 |
| 5,095,357 | 3/1992 | Andoh | 357/51 |
| 5,100,714 | 3/1992 | Zsamboky | 428/137 |

*Primary Examiner*—Timothy Speer
*Attorney, Agent, or Firm*—Howard J. Greenwald

[57] ABSTRACT

A process for preparing an insulated metallized substrate, wherein a specified metallized substrate is heated from ambient temperature to a peak temperature of at least about 800 degrees centigrade while contacting the substrate with an inert atmosphere containing less than 10 parts per million of oxygen, maintained at such peak temperature for a specified period of time while being contacted with said inert gas, and thereafter heated at a peak temperature of at least about 800 degrees centigrade while being contacted with a gas containing at least 100 parts per million of oxygen.

1 Claim, 23 Drawing Sheets

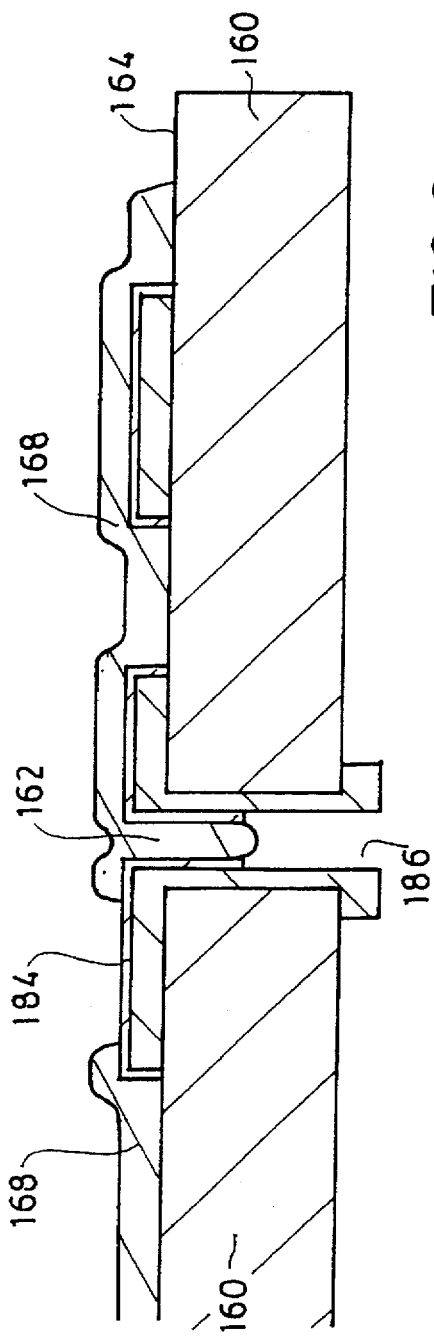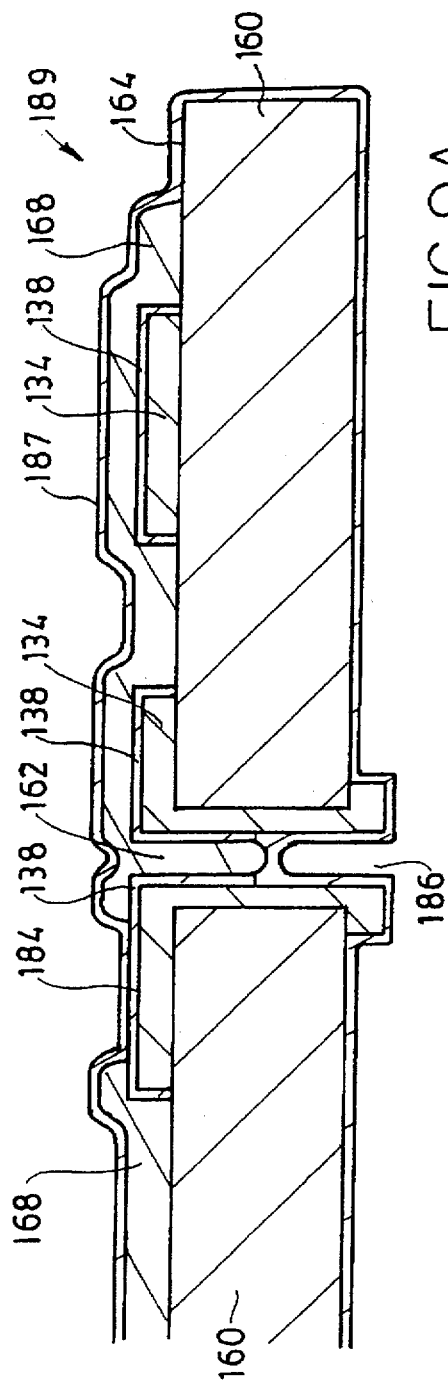

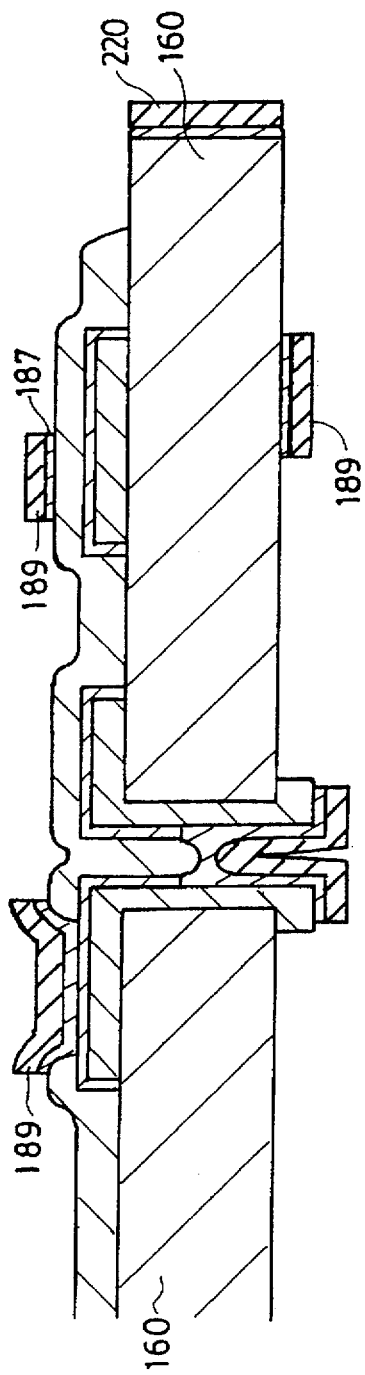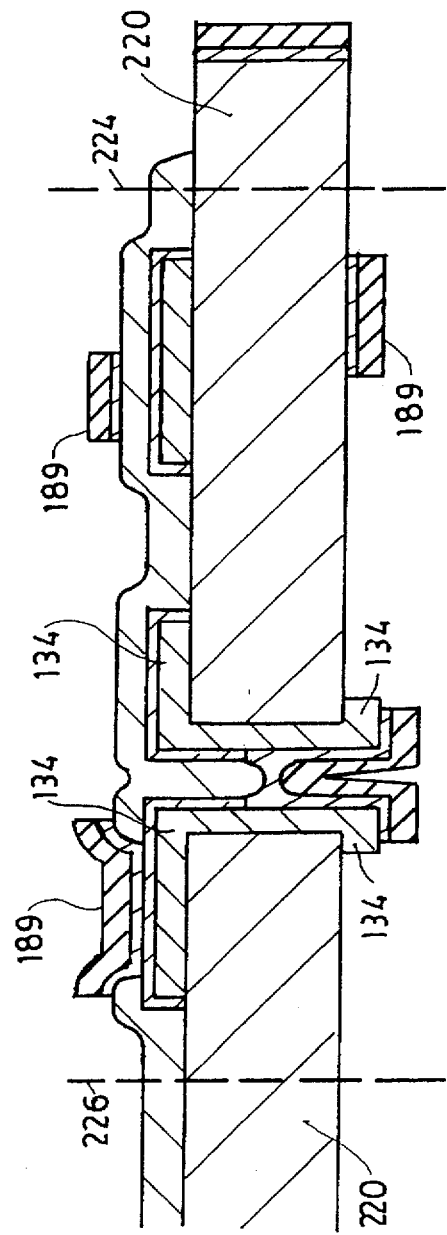

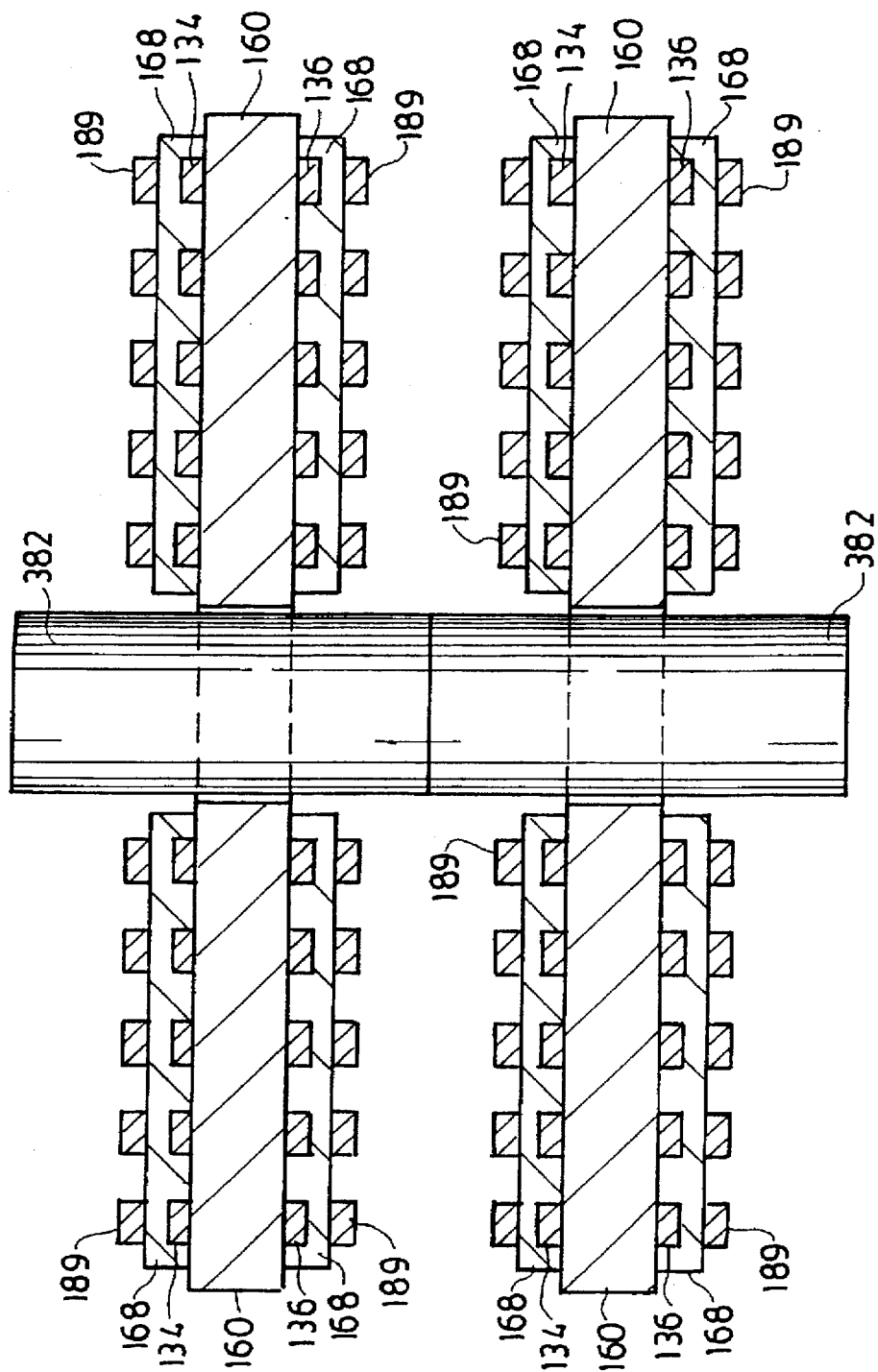

STACKED PLANAR TRANSFORMER

FIELD OF THE INVENTION

A process for preparing an insulated multilayer structure in which a metallized substrate is patterned with a layer of insulating material.

BACKGROUND OF THE INVENTION

Multilayer electronic structures are known to those skilled in the art. They are discussed, e.g., in an article by Ananda H. Kumar et al. entitled "Glass-Ceramic/Copper Multilayer Substrates for High Performance Computers—Materials & Process Challenges," 1991 Proceedings of the International Symposium on Microelectronics, (International Society for Hybrid Microelectronics, Reston, Va., 1991), at pages 1–5; the authors of this article were employed the General Technology Division of I.B.M. Corporation, and the article presumably discussed I.B.M. technology.

The authors of this article teach (at page 1 thereof) that the use of copper in the multilayer assembly is desirable because it increases "... the conductivity of the thick film lines three fold." However, despite this substantial advantage of copper, the authors disclose that the use of copper presents several distinct problems.

Thus, at pages 3 of this article, the authors teach that poor adhesion is often obtained between the layers of copper and the layers of ceramic material, disclosing that "The large difference in the thermal expansion coefficients of the glass-ceramic ... and of copper ... is a source of concern for the integrity of the interface between the two ...."

The authors also teach that, in order to overcome some of the problems associated with the use of copper, steps must be taken to insure that the copper is not oxidized. Thus, at page 3 of this article, they state that "Two important considerations in sintering these substrates are the prevention copper oxidation and the complete removal of carbon residue from the binder." Furthermore, on the same page 3 of this article, the authors disclose the use of a process in which steam mixed with small quantities of hydrogen are used during the sintering cycle, stating that "The latter prevents the oxidation of copper."

However, even the use the steam/hydrogen atmosphere during sintering which is disclosed by these authors does not provide a finished structure in the process described in this article. As is disclosed on page 4 of the article, what is further required is "Fabrication of two levels of polyimide-copper thin film structure on the substrate surface ...."

Many other authors have recognized and discussed the problems associated with the use of copper in multilayer electronic assemblies. Thus, e.g., in an article by Satish S. Tamhankar et al. entitled "Optimization of Atmosphere Doping for Firing Photoformable Copper Thick Film Materials," (1990 Proceedings of the International Symposium on Microelectronics, International Society for Hybrid Microelectronics, Reston, Va., 1990, at pages 75–83), this issue was also discussed.

At page 75 of this Tamhankar et al. article, the authors correctly note that "In microelectronic packaging, an increasing emphasis on high performance applications is evident .... Copper thick film systems have some unique properties to meet these high performance requirements. Compared to precious metals, copper has high electrical conductivity, excellent resistance to migration and to solder leach, excellent solderability, reworkability, low cost, and stable pricing structure."

However, the Tamhankar et al. article (at page 75) also correctly notes that the use of copper presents many problems, stating that "In spite of the many advantages, copper based thick film systems have not gained widespread popularity. This has been due to the difficulties experienced in processing these materials."

One of the "... difficulties ..." mentioned by Tamhankar et al. is that "... since copper is prone to oxidation, copper based systems have to be fired in a nitrogen atmosphere ..."

Applicants have discovered that, by starting with a specified metallized substrate and processing it in a certain sequence, they can overcome many of the disadvantages associated with the prior art's use of copper while retaining substantially all of the advantages.

U.S. Pat. Nos. 5,100,714 and 5,058,799 describe a process for preparing a metallized ceramic substrate having an enhanced bond strength; the entire disclosure of each of these patents is hereby incorporated by reference into this specification. The substrate produced by the process of these patents may be used to produce the products described and claimed in this patent application.

It is an object of this invention to provide a process for preparing an insulated metallized substrate which can be further processed to produce a multilayer electronic device which has excellent definition of the conductor(s).

It is another object of this invention to provide a process for preparing an insulated metallized substrate which can be further processed to produce a multilayer electronic device which has excellent dielectric properties and preferably has finely patterned electroformed conductors throughout the structure.

It is another object of this invention to provide a process for preparing an insulated metallized substrate which can be further processed to produce a multilayer electronic device which has excellent electrical and thermal conductivity properties.

It is another object of this invention to provide a process for preparing an insulated metallized substrate which can be further processed to produce a multilayer electronic device which does not degrade when exposed to high temperature.

It is another object of this invention to provide a process for preparing an insulated metallized substrate which can be further processed to produce a multilayer electronic device which is capable of being joined to other structures without adversely affecting its properties.

It is yet another object of this invention to provide multilayer electronic devices with finely patterned dielectric layers using finely patterned electroformed metal conductor patterns.

It is yet another object of this invention to produce multilayer electronic devices containing vias with high ductility and adhesion in such devices.

It is yet another object of this invention to provide a process for firing a normally air-fireable dielectric material in a nitrogen atmosphere.

It is another object of this invention to provide an insulated metallized substrate which is hermetic.

It is another object of this invention to provide an insulated metallized substrate with excellent physical properties.

It is another object of this invention to provide an insulated metallized substrate to which electrical components may be readily and durably affixed in a multiplicity of ways.

It is another object of this invention to provide a multilayer electronic device which has excellent definition of the conductor(s).

It is another object of this invention to provide a multilayer electronic device which has excellent dielectric properties.

It is another object of this invention to provide multilayer planar motors.

It is yet another object of this invention to provide a multilayer planar commutator.

It is yet another object of this invention to provide a process for preparing a multilayer electronic assembly in which electroformed patterning of metal conductor material is included in several layers of a cofired structure with the use of a transfer technique.

It is yet another object of this invention to provide a process in which dielectric material is applied to plated via pipes in order to create a fine-patterned dielectric structure.

It is another object of this invention to provide a multilayer electronic device which does not degrade when exposed to high temperature.

It is another object of this invention to provide a planar transformer made from a multilayer structure of metal and dielectric material.

It is another object of this invention to provide a high density multichip module package comprised of layers of plated metal and dielectric material.

It is another object of this invention to provide a microminiature electric motor comprised of layers of metal and dielectric material.

It is another object of this invention to provide a solenoid comprised of alternating planar inductive coils.

SUMMARY OF THE INVENTION

In accordance with this invention, there is provided a process for preparing an insulated metallized substrate in which the exterior surfaces of a metallized substrate are first subjected to a specified heat treatment and thereafter contacted with dielectric material.

BRIEF DESCRIPTION OF THE DRAWINGS

The present invention will be more fully understood by reference to the following detailed description thereof, when read in conjunction with the attached drawings, wherein like reference numerals refer to like elements, and wherein:

FIGS. 7, 8, 9, 9A, 10, 11, 12, 13, 14, 15, and 16 present sectional views of a ceramic/metal substrate and its configurations as it is processed through various steps and stages of applicants' process;

FIG. 25A is a sectional view of another stacked planar transformer made in accordance with applicants' process;

DESCRIPTION OF THE PREFERRED EMBODIMENTS

In applicants' preferred process, a metallized substrate is first provided, and its surfaces are then treated prior to the time they are contacted with a mixture of liquid and ceramic material.

Figure 1:
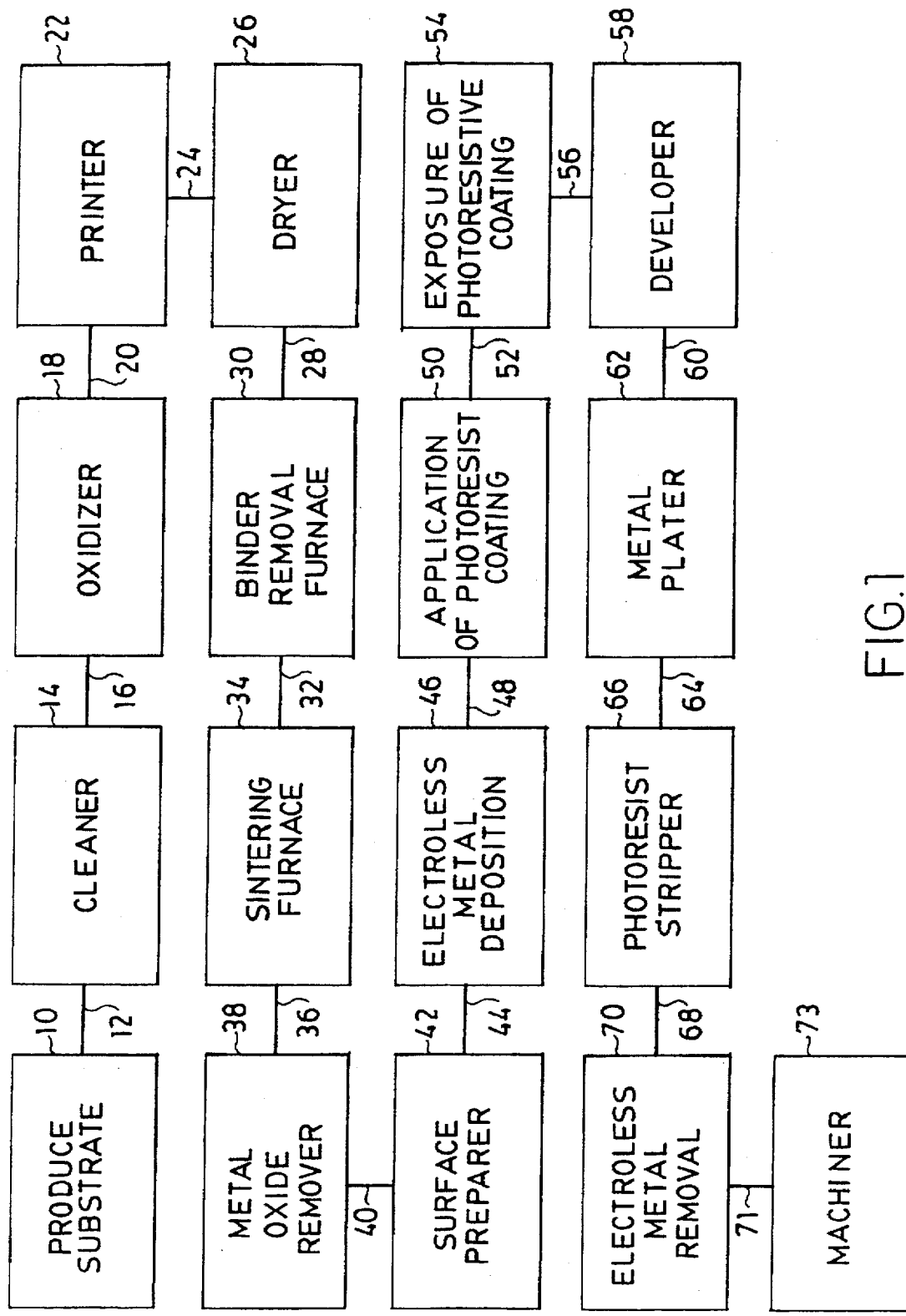
FIG. 1 is a flow diagram of one preferred process of this invention.

FIG. 1 is a flow chart illustrating one preferred embodiment of applicants' invention. Referring to FIG. 1, in the first step (step 10) of the preferred process depicted, a metallized substrate is produced. In general, the process of U.S. Pat. Nos. 5,058,799 and 5,100,714, or comparable processes, may be used to prepare the metallized substrate. The particular metallized substrates which may be advantageously used in the process are described elsewhere in this specification.

Referring again to FIG. 1, the substrate is passed via line 12 to cleaner 14, wherein it is cleaned to remove contaminants. One preferred high temperature cleaning process, which involves exposure of the substrate to an inert atmosphere, is described elsewhere in this specification.

The cleaned substrate is then passed via line 16 to oxidizer 18 in which at least a portion of the exterior faces of the substrate is oxidized by preferably heating it while exposing it to an inert gas comprised of a specified amount of oxygen. This preferred oxidation step also is described in more detail elsewhere in this specification, but other means of producing the desired degree of oxidation also may be used.

The oxidized substrate is then passed via line 20 to printer 22 in which a patterned layer of dielectric is applied to the exterior faces of the substrate. This printing step is also described in more detail elsewhere in this specification.

The printed substrate is then passed via line 24 to dryer 26 in which solvent present in the dielectric is removed. The dried substrate is then passed via line 28 to binder removal furnace 30 to effect removal of organic matter from the dried slurry coating. These steps are described in more detail elsewhere in this specification.

The substrate is then passed via line 32 to sintering furnace 34, in which the dried slurry layer is densified. This densified substrate is then passed via line 36 to metal oxide remover 38, in which metal oxide on the surface of the substrate which was not covered by the dielectric applied in printer 22 is removed. These steps are also described in more detail elsewhere in this specification.

The treated substrate from which metal oxide has been removed is then passed via line 40 to surface preparer 42, in which the exterior surfaces of the substrate are treated in preparation for subsequent deposition of metal. The prepared substrate is then passed via line 44 to electroless metal deposition step 46, in which a layer of metal is electrolessly deposited onto the substrate structure.

The substrate coated with metal from step 46 is then passed via line 48 to step 50, in which a coating of photoresistive material is applied to the substrate. The coated substrate from step 50 is then passed via line 52 to step 54, in which the photoresistive coating is selectively exposed to ultraviolet radiation to selectively harden areas of the coating. These steps are described in more detail elsewhere in the specification.

The exposed substrate from step 54 is then passed via line 56 to developer 58, in which a portion of the photoresistive coating is removed. The substrate from step 58 is then passed via line 60 to metal plater 62, in which metal is then plated onto those areas from which the photoresistive coating has been removed.

The plated substrate is then passed via line 64 to photoresist stripper 66, in which excess photoresist material is removed. Thereafter, the printed substrate is then passed via line 68 to electroless metal removal step 70 and, thereafter, via line 71 to machiner 73, wherein the printed substrate may be cut to the desired size.

Alternatively, or additionally, the printed substrate may be passed to cleaner 14, where the process may be repeated as required to add additional layers of ceramic material and/or metal material prior to the time the printed substrate is cut to the desired size(s).

The Substrate Used in Applicants' Process

Referring to FIG. 1, in the first step of applicants' process, a metallized substrate with specified properties is provided.

The metallized substrate used in applicants' process is a workpiece, such as a ceramic workpiece, having a working surface unitary with the workpiece and containing a layer of electrically conductive metal on the working surface; see, e.g., U.S. Pat. No. 5,100,714 for an illustration of the preparation of such a workpiece.

In the preferred metallized substrate used in applicants' process, a heterogeneous juncture band exists between the workpiece and the conductive metal layer which is substantially coextensive with the conductive metal layer and the working surface. It is preferred, but not essential, that this heterogeneous juncture band has a metal-wetted surface area which is at least about twice the apparent surface area of the metal layer overlying the juncture band, consists essentially of workpiece grains unitary with said workpiece and conductive metal unitary with said conductive metal layer, and it is constituted by finger-like metal protuberances unitary with the metal layer and occupying the space between the ceramic grains.

In addition to having such heterogeneous juncture band, the metallized substrate used in applicants' process is preferably capable of withstanding repeated firing cycles at a temperature in excess of 400 degrees centigrade without separation of the metal layer from the working surface of the workpiece. In one embodiment, the metallized substrate used in applicants' process is capable of withstanding repeated firing cycles at a temperature in excess of 600 degrees centigrade without separation of the metal layer from the working surface of the workpiece. In another preferred embodiment, the metallized substrate used in applicants' process is capable of withstanding repeated firing cycles at a temperature in excess of 850 degrees centigrade without separation of the metal layer from the working surface of the workpiece.

In one preferred embodiment, the substrate used in step 14 of applicants' process is a metallized ceramic substrate. The preparation of such a substrate is described in the aforementioned U.S. Pat. Nos. 5,058,799 and 5,100,714, the entire descriptions of which are hereby incorporated by reference into this specification.

As used herein, the term ceramic refers to a compound or composition which (1) is nonmetallic (i.e., does not contain elemental metal), (2) is generally subjected to a temperature in excess of 540 degrees centigrade during its manufacture and/or use, (3) frequently contains one or more metallic oxides, borides, carbides, and/or nitrides, and/or mixtures and/or compounds of such materials, and (4) is inorganic (i.e., is not any compound which contains carbon [such as hydrocarbon], with the exception of carbon oxides, carbon disulfide, and metal carbides). See, e.g., page 54 of Loran S. O'Bannon's "Dictionary of Ceramic Science and Engineering" (Plenum Press, New York, 1984).

Ceramic substrates, and/or substrates comprised of ceramic material, are well known to those skilled in the art. Thus, by way of illustration and not limitation, one may use one or more of the ceramic substrates described in U.S. Pat. Nos. 5,108,716 (a honeycomb type monolithic ceramic substrate), 5,106,654 (porous ceramic substrate), 5,097,246 (glass), 5,089,881, 5,087,413 (a multilayer ceramic substrate comprised of a multiplicity of vias), 5,084,650 (a transparent ceramic substrate.), 5,082,163 (aluminum nitride metallized with copper), 5,081,563 (a multilayer ceramic glass-ceramic substrate formed of a stacked plurality of generally parallel signal and insulating layers), 5,081,073 (a superconducting ceramic substrate), 5,081,067, 5,080,966 (a multilayer ceramic substrate comprised of filled vias), 5,080,958, 5,080,929 (a ceramic substrate with through holes), 5,077,091 (a ceramic substrate based on nitrides or carbonitrides of at least one metallic element selected from Cr, V, Zr, W, Mo, Co, Mn, Ni, Hf and Ta), 5,077,079 (a bioadaptable ceramic substrate), 5,075,765, 5,070,602, 5,070,393 (an aluminum nitride substrate), 5,070,343 (a ceramic substrate with a plurality of U-shaped grooves), 5,068,156, 5,066,620, 5,065,106, 5,063,121 (sintered nitride ceramic), 5,062,913 (a laminated ceramic substrate), 5,061,552 (a multi-layer ceramic substrate assembly, 5,057,964, 5,057,376 (a glass ceramic substrate), 5,057,163 (a conductive ceramic substrate), 5,056,227 (a polycrystalline ceramic substrate), 5,055,914, 5,053,361 (a multilayer ceramic substrate laminate), 5,050,296, 5,047,368, 5,043,223 (a multilayer ceramic substrate), 5,041,809 (a glass-ceramic substrate), 5,041,342, 5,041,016, 5,036,167, 5,035,837, 5,034,850, 5,033,666, 5,030,396 (a ceramic shaped implant having a porous layer), 5,029,043, 5,023,407, 5,016,023, 5,014,161, 5,013,607 (a transparent conductive ceramic substrate), 5,013,312, 5,011,734 (a ceramic substrate which has on its surface a metallized layer made of Au or Cu, or Au-Pt, Au-Pd, Cu-Pt or Cu-Pd alloy that is overlaid with a Ni plating layer), 5,011,732 (a glass ceramic substrate containing an electrically conductive film formed thereon), 5,008,151, 5,008,149 (metallized ceramic substrate), 5,006,673 (a universal ceramic substrate), 5,004,640, 4,999,731, 4,996,588, 4,994,302, 4,992,772, 4,990,720, 4,989,117, 4,987,009, 4,986,849, 4,985,097 (glass), 4,978,452, 4,976,145, 4,973,982, 4,971,738, 4,970,577, 4,967,315, 4,963,437, 4,960,752 (a polycrystalline superconductor), 5,959,507, 4,959,255, 4,958,539, and the like. The disclosure of each of these United States patents is hereby incorporated by reference into this specification.

In one preferred aspect of this embodiment, the ceramic material used is alumina. Thus, e.g., the substrate may consist essentially of alumina ceramic (any ceramic whiteware in which alumina is the essential crystalline phase).

In one preferred embodiment, the alumina is a "white alumina" substrate which has a density of at least about 3.7 grams per cubic centimeter and is comprised of at least about 90 weight percent of aluminum oxide. In another preferred embodiment, the alumina used is "black alumina."

Figure 2:
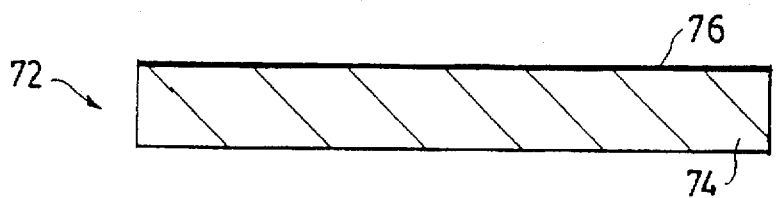
FIG. 2 is a sectional view of one substrate which may be used in applicants' preferred process.

In one embodiment, illustrated in FIG. 2, the ceramic substrate 72 consists essentially of alumina and is comprised of a base 74 of relatively low density alumina material and, integrally bonded thereto, a layer 76 of higher density alumina material. In this embodiment, it is preferred that the porosity of layer 76 be less than the porosity of layer 74. In an especially preferred embodiment, layer 76 has a porosity such that it is substantially impervious to liquid penetration.

In this embodiment, in general, layer 76 preferably has a thickness of at least about 5 times the average grain size of the particles in layer 76.

In another embodiment, not shown, layer 74 is made from one type of ceramic material, and layer 76 comprises or consists essentially of another type of ceramic material.

Referring again to FIG. 1, and by way of further illustration, the ceramic substrate used in step 14 may be a porcelain covered metal or metal alloy material. Furthermore, the ceramic substrate may be porcelain/ceramic covered graphite, porcelain/ceramic covered silicon carbide, and the like.

Porcelain covered metal materials, and processes for making them, are well-known to those skilled in the art. Reference may be had, e.g., to U.S. Pat. Nos. 5,053,740, 5,012,182, 5,002,903, 4,957,440, 4,894,609, 4,620,841, 4,619,810, 4,576,789, 4,556,598, 4,393,438, 4,365,168, 4,328,614, 4,010,048, 3,585,064, 2,563,502, 4,407,868, and the like. The disclosure of each of these patents is hereby incorporated by reference into this specification.

In one preferred embodiment, the ceramic substrate is comprised of or consists essentially of a ferromagnetic material, such as a ferrite.

As is known to those skilled in the art, a ferrite is a ferromagnetic compound containing $Fe_2O_3$. See, for example, U.S. Pat. No. 3,576,672 of Harris et al., the entire disclosure of which is hereby incorporated by reference into this specification.

In one embodiment, the ferrite is a garnet. Iron garnet has the formula $M_3Fe_5O_{12}$; see, e.g., pages 65–256 of Wilhelm H. Von Aulock's "Handbook of Microwave Ferrite Materials" (Academic Press, New York, 1965). Garnet ferrites are also described, e.g., in U.S. Pat. No. 4,721,547, the disclosure of which is hereby incorporated by reference into this specification.

In another embodiment, the ferrite is a spinel ferrite. Spinel ferrites usually have the formula $MFe_2O_4$, wherein M is a divalent metal ion and Fe is a trivalent iron ion. M is typically selected from the group consisting of nickel, zinc, magnesium, manganese, and like. These spinel ferrites are well known and are described, for example, in U.S. Pat. Nos. 5,001,014, 5,000,909, 4,966,625, 4,960,582, 4,957,812, 4,880,599, 4,862,117, 4,855,205, 4,680,130, 4,490,268, 3,822,210, 3,635,898, 3,542,685, 3,421,933, and the like. The disclosure of each of these patents is hereby incorporated by reference into this specification. Reference may also be had to pages 269–406 of the Aulock book for a discussion of spinel ferrites.

In yet another embodiment, the ferrite is a lithium ferrite. Lithium ferrites are often described by the formula $(Li_{0.5}Fe_{0.5})^{2+}(Fe_2)^{3+}O_4$. Some illustrative lithium ferrites are described on pages 407–434 of the aforementioned Aulock book and in U.S. Pat. Nos. 4,277,356, 4,238,342, 4,177,438, 4,155,963, 4,093,781, 4,067,922, 3,998,757, 3,767,581, 3,640,867, and the like. The disclosure of each of these patents is hereby incorporated by reference into this specification.

In yet another embodiment, the preferred ferrite is a hexagonal ferrite. These ferrites are well known and are disclosed on pages 451–518 of the Aulock book and also in U.S. Pat. Nos. 4,816,292, 4,189,521, 5,061,586, 5,055,322, 5,051,201, 5,047,290, 5,036,629, 5,034,243, 5,032,931, and the like. The disclosure of each of these patents is hereby incorporated by reference into this specification.

In one preferred embodiment, the ceramic substrate is comprised of a superconductive material. In this embodiment, it is preferred that the superconductive material have a critical temperature of greater than about 77 degrees Kelvin and, more preferably, greater than about 85 degrees Kelvin. These superconductive materials are well known to those skilled in the art and are described, e.g., in U.S. Pat. No. 5,015,619, the entire disclosure of which is hereby incorporated into this specification by reference.

In another embodiment, and by way of further illustration, the ceramic material used, in whole or in part, to construct the substrate may be, e.g., barium titanate, neodymium nitride, neodymium oxide, and the like.

In one embodiment, the ceramic substrate is comprised of ceramic microspheres. Ceramic microsphere structures are well known to those skilled in the art and are described, e.g., in U.S. Pat. Nos. 4,936,384 and 4,822,422, the entire disclosures of which are hereby incorporated by reference into this specification.

Figure 3:
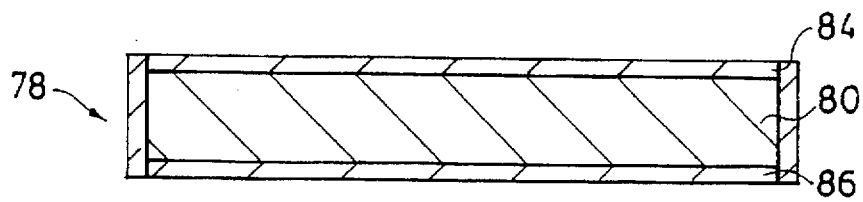
FIG. 3 is a sectional view of another substrate which may be used in applicants' preferred process.

FIG. 3 illustrates one typical laminated structure which may be used as the ceramic substrate. Referring to FIG. 3, it will be seen that substrate 78 is comprised of metal and/or metal alloy base 80 and, bonded thereto, porcelain layers 84 and 86. As will be apparent to those skilled in the art, base 80 may be a substantially homogeneous material consisting essentially of only one metal or metal alloy. Alternatively, base 80 may be a laminated structure (such as a laminate of copper/Invar/copper, or copper/molybdenum/copper. As is known to those skilled in the art, Invar is a trademark for an iron-nickel alloy containing 40–50% nickel and characterized by an extremely low coefficient of thermal expansion. Other suitable metal- and/or alloy-containing bases 80 will be apparent to those skilled in the art.

As will be apparent to those skilled in the art, the ceramic substrate preferably used in step 14 may, but need not, contain ceramic throughout its entire structure, as long as the exterior layers of such structure consist essentially of one or more ceramic materials.

It is preferred that the ceramic substrate used, regardless of whether it consists essentially of or is only comprised of ceramic material, have a volume resistivity of at least about $10^{10}$ ohm-centimeters and, additionally, have a thermal conductivity at least about 10 watts/meter-degrees Centigrade. As is known to those skilled in the art, these properties may be measured by A.S.T.M. Standard Test D1829.

By way of illustration and not limitation, one may use ceramic substrates sold by the Coors Ceramics Company of 17750 West 32nd Avenue, Golden, Colorado as product numbers ADO-90, AD-94, and AD-96. These products have a bulk density (A.S.T.M. C373) of from about 3.7 to about 3.8 grams per cubic centimeter, a Rockwell hardness (A.S.T.M. E18) of from about 75 to about 80), a coefficient of linear thermal expansion (A.S.T.M. C372) of from about 3 to $8 \times 10^{-6}$ per degree Centigrade, a flexural strength (A.S.T.M. F417 and F394) of from about 40,000 to 60,000 pounds per square inch, a water absorption (A.S.T.M. C373) of 0 percent, and a compressive strength (A.S.T.M. C773) of from about 300,000 to about 400,00 pounds per square inch.

In another embodiment, the substrate used in step 14 either consists essentially of graphite or, alternatively, contains a coated structure similar to that of FIGS. 2 and/or 3 in which the graphite appears as either layer 76 (see FIG. 2) and/or layers 84 and/or 86. In this embodiment, the base 74 (see FIG. 2) and/or 80 (see FIG. 3) may be ceramic material, inorganic metal oxide material, and the like.

In another embodiment, the substrate used in step 14 either consists essentially of plastic material or, alternatively, contains a coated structure similar to that of FIGS. 2 and 3. In this embodiment, one may use suitable plastics such as epoxy resin.

Referring again to FIG. 1, it is preferred that the substrate used in step 14 contain at least one through hole which extends from its top surface to its bottom surface. The preparation of substrates with this configuration is well described in U.S. Pat. Nos. 5,058,799 and 5,100,714.

In one embodiment, the substrate is a ceramic substrate which contains a multiplicity of vias extending into the ceramic substrate to a depth of at least about one-fifth of its thickness up to about 100 percent of its thickness. In one aspect of this embodiment, the extensions are circular in cross-section and preferably have a diameter of from about 4 to about 20 mils. In another aspect of this embodiment, there are at least about 25 such vias within an area of 0.01 square inches on at least a portion of the ceramic substrate. In yet another aspect of this embodiment, there are at least about 100 such vias within an area of 0.01 square inches on at least a portion of the ceramic substrate.

Figure 4:
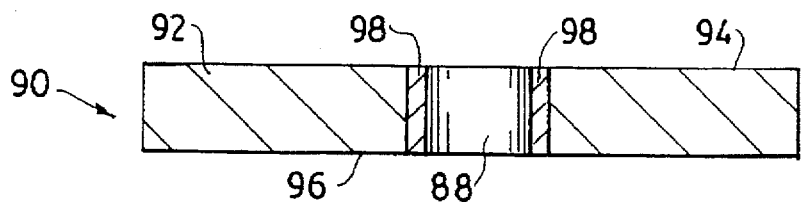
FIG. 4 is a sectional view of yet another substrate which may be used in applicants' preferred process.

In one preferred embodiment, the ceramic substrate contains a through hole 88 (see FIG. 4). Referring to FIG. 4, it will be seen that, in this embodiment, substrate 90 is comprised of ceramic material 92, via 88 which extends from top surface 94 to bottom surface 96 of substrate 90, and a layer of metal 98 covering the wall of hole 88. The production of such a metallized via structure is disclosed, e.g., in the aforementioned Zsamboky patents.

In the remainder of this specification, reference will often be made to the processing of a substrate comprised of alumina and copper. It will be understood, however, that the comments made with respect to the processing of this particular substrate are equally applicable to the processing of other substrates which may be used in applicants' process.

The Cleaning of the Metallized Substrate

Referring again to FIG. 1, in step 14 the substrate material is preferably cleaned. The goal of such cleaning is to remove loose contaminants present in the substrate.

Figure 5:
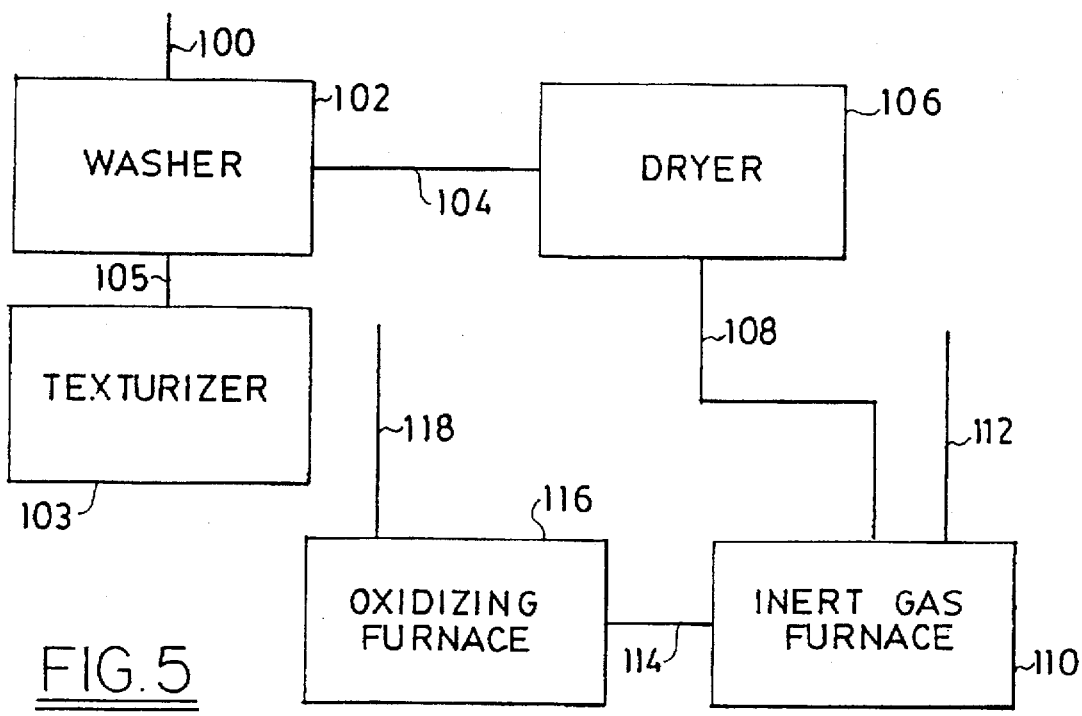
FIG. 5 is a flow diagram of a preferred cleaning process which may be used as one aspect of applicants' claimed process.

FIG. 5 is a flow diagram illustrating one preferred cleaning process. Referring to FIG. 5, and in the preferred embodiment illustrated therein, the substrate is preferably charged via line 100 to washer 102, wherein it is preferably washed. In general, a soapy mixture of industrial detergent is applied to the substrate. Thus, the substrate may be allowed to soak in a soapy mixture of the detergent for up to about 20 minutes and thereafter may be rinsed with deionized water.

In one preferred embodiment, illustrated in FIG. 5, prior to the time the substrate is washed in washer 102 its surface is etched in texturizer 103. As is known to those skilled in the art, this step can be achieved by conventional etchants. Thus, e.g., when the metal layer involved is copper, one may utilize "ENPLATE" ad-485, which is a mild etchant for copper surfaces which is sold by the Enthone-OMI Inc. Company of New Haven, Conn. Other comparable etchants also may be used. After such etching, the etched device may be passed to washer 102 via line 105 for processing as described hereinafter.

The washed substrate may then be passed via line 104 to dryer 106, wherein it is preferably dried to a moisture content of less than about 5 weight percent.

In the next stage of the process, a layer of metal oxide is formed on the surface of the metal in the substrate. Applicants have presented one preferred means of forming this metal oxide. It is to be understood, however, that other such means could be used and still be within the spirit and scope of this invention.

In applicants' preferred process, the dried substrate is passed via line 108 to inert gas furnace 110, wherein it is preferably fired at a temperature of at least 800 degrees centigrade for at least about 5 minutes while being contacted with an inert atmosphere, which may be introduced via line 112. In one preferred embodiment, the inert atmosphere consists essentially of nitrogen, which is preferably allowed to flow over the substrate. It is preferred that the oxygen content in the furnace 110 be less than about 10 parts per million.

In one preferred embodiment, the dried substrate is passed through a conveyor furnace (not shown) in which the middle of furnace is at the desired peak temperature and the ends of the furnace are each preferably at less than about 100 degrees Centigrade. In this embodiment, it is preferred to raise the temperature of the dried substrate from about ambient to the desired peak temperature over a period of at least about 20 minutes and, preferably, at least about 40 minutes; and it is preferred to utilize a peak temperature of from about 800 to about 950 degrees centigrade for from about 5 to about 20 minutes. Thereafter, when the substrate is to be transferred to a second furnace for the oxidation heat treatment processing, it is preferred to cool the heated substrate to ambient over a period of at least about 15 minutes and, more preferably, at least from about 15 to about 30 minutes; when the oxidation heat processing occurs in the same furnace, however, this cooling step may be omitted. During the entire time the substrate is heated at a temperature in excess of 100 degrees centigrade, however, it preferably is contacted with the inert atmosphere which is comprised of less than 10 parts per million of oxygen.

Conveyor furnaces are well known to those skilled in the art and are described, e.g., in U.S. Pat. Nos. 5,096,478, 5,088,920, 5,003,160, 4,997,364, 4,986,842, and the like; the disclosure of each of these United States patents is hereby incorporated by reference into this specification.

When utilizing a conveyor furnace, it is preferred to support the substrate by its edges so that the flowing inert gas can contact both the top and bottom surfaces of the substrate and the conveyor belt is not contiguous with the faces of the substrate.

In one preferred embodiment, a temperature of at least about 900 degrees centigrade is used in furnace 110.

In the embodiment where two separate furnaces are utilized, the substrate passing from furnace 110 is preferably at ambient temperature. Thereafter, this substrate is passed via line 114 to oxidizing furnace 116, wherein it is subjected to a specified firing profile.

It will be appreciated by those skilled in the arts that both of the heat-treatment cycles could be effected in the same furnace by changing the atmosphere used at the appropriate time(s). In this embodiment, however, the need to cool the substrate after exposure to inert gas and then again raise it to peak temperature prior to exposing it to the mild oxidizing atmosphere may be omitted.

In the first part of the firing profile in furnace 116, the temperature of the furnace is raised from ambient to about at least about 800 degrees centigrade over a period of at least about 5 minutes; it is preferred to raise the temperature of the substrate to a temperature of at least about 800 to about 950 degrees centigrade over a period of from about 5 minutes to about 20 minutes. During this step, the atmosphere in the furnace is preferably substantially inert, containing less than about 10 parts per million of elemental oxygen.

Once the furnace 116 has reached a temperature of at least about 800 degrees centigrade, however, an oxygen-containing gas (such as, e.g., oxygen, air, mixtures thereof, and the like) is introduced via line 118 in order to introduce at least about 100 parts per million of oxygen (and, preferably from about 100 to about 500 parts per million [by total volume of the atmosphere in furnace 116] of elemental oxygen). It is preferred to contact this "oxidizing atmosphere" with the substrate while the substrate is at a temperature above 800 degrees centigrade for at least about 5 minutes and, preferably, for at least from about 5 to about 20 minutes.

Thereafter, the substrate is allowed to cool to ambient over a period of at least about 15 minutes while the substrate is contacted with an inert atmosphere containing less than about 10 parts per million of oxygen.

Figure 6:
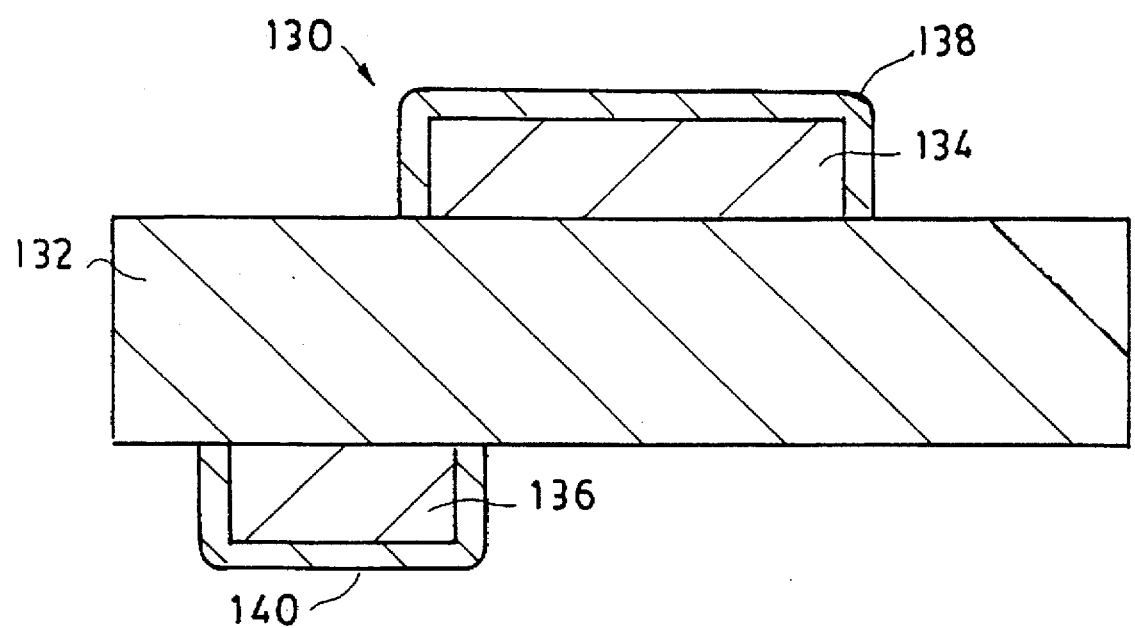
FIG. 6 is a schematic of one preferred metallized ceramic substrate.

The substrate produced via this process is schematically represented in FIG. 6, which illustrates a copper/ceramic/copper device. It will be apparent to those skilled in the art that, when other substrates are used as starting materials and/or when other metals are used for metallizing, different, but comparable, devices will be produced.

Referring to FIG. 6, which is a sectional view of one preferred substrate produced in the process, It will be seen that substrate 130 is comprised of a ceramic core 132 (such as, e.g., alumina) and, bonded to portions thereto, copper patterned layers 134 and 136. The 132/134/136 structures, in one preferred embodiment, are produced by the process described in U.S. Pat. No. 5,058,799.

In general, each of copper layers 134 and 136 has a thickness of from about 10 to about 250 microns and, more preferably, from about 25 to about 125 microns. By comparison, ceramic layer 132 generally has a thickness of from about 250 to about 30,000 microns and, more preferably, from about 500 to about 1500 microns.

Formed on top of each of copper layers 134 and 136 is a relatively thin layer of cuprous oxide ($Cu_2O$). This cuprous oxide is believed to be a reddish, crystalline material with a specific gravity of about 6 and a melting point of about 1,235 degrees centigrade; it is insoluble in water.

Referring again to FIG. 6, it will be seen that each of cuprous oxide layers 138 and 140 have a thickness of less than 10 microns and preferably are from about 1 to about 10 microns thick.

The aforementioned oxidation step has been described with reference to forming a metal oxide (such as cuprous oxide) on the surface of the metal layer (such as copper). However, other oxides also may be formed on the metal layer, or deposited on such layer, to provide a layer of oxide material which is of the desired thickness (from 1 to 10 microns thick) and, furthermore, provide an oxidation-resistant layer on top of the metal.

Thus, by way of illustration and not limitation, one may form and/or apply to such metal layer(s) one or more of the oxides of silica (in the form of glass), tantalum, hafnium, zirconium, titanium, berylium, magnesium, barium, and the like.

Referring again to FIG. 1, after oxidation in oxidizer 18, the oxidized substrate is passed via line 20 to printer 22. Printer 22 is preferably a screen printing apparatus.

Any of the screen printing apparatuses well known to those skilled in the art may be used as printer 22. Thus, by way of illustration and not limitation, one may use the devices, processes, and reagents described in U.S. Pat. Nos. 5,107,587, 5,091,221, 5,089,465, 5,089,070, 5,083,058, 5,036,167, 5,035,965, 5,032,571, 5,028,867, 5,000,090, 4,973,826, 4,959,256, 4,958,560, and the like. The disclosure of each of these United States patents is hereby incorporated by reference into this specification.

At this point in the process, and thereafter, the combined metal/metal oxide layers (such as layers 136/140 and 134/138 of FIG. 6) preferably provide a resistivity of less than about $1.9 \times 10^{-6}$ ohm-centimeters. In one preferred embodiment, the combined metal/metal oxide layers preferably have a melting point of at least 1,000 degrees centigrade. Furthermore, it is preferred that the combined metal/metal oxide layers adhere to each other well enough to be able to pass A.S.T.M. test D3528.

It is preferred to produce a structure from the substrate that will be substantially hermetic, to which or from which helium cannot enter or escape at a rate exceeding $10^{-8}$ cubic centimeters per atmosphere differential per second at ambient temperature and a metal thickness of at least 0.0005". As is known to those skilled in the art, the hermeticity of the structure may be tested by standard hermeticity tests (such as, e.g., Military Specification 883, method 1014, or A.S.T.M. Standard test F979).

The desired structure is an insulated metallized substrate which comprises a workpiece having a working surface unitary with the workpiece, a layer of electrically conductive metal on said working surface, a layer of metal oxide on said layer of conductive metal, and a layer of ceramic material on said layer of metal oxide, and a heterogeneous juncture band between said workpiece and said conductive metal layer, substantially coextensive with said conductive metal layer and said working surface, wherein: (1) said heterogeneous juncture band consists essentially of grains unitary with said workpiece and conductive metal unitary with said conductive metal layer and is constituted by finger-like metal protuberances unitary with the metal layer and occupying the space between said grains, wherein said metallized substrate is capable of withstanding repeated firing cycles at a temperature in excess of 400 degrees centigrade without separation of the metal layer from the working surface of the workpiece, (2) the layer of electrically conductive metal has a thickness of from about 10 to about 250 microns, provided that the thickness of said layer of electrically conductive metal is at least about ten times as great as the thickness of said layer of metal oxide, (3) the layer of metal oxide has a thickness of from about 0.1 to about 10 microns, and (4) the layer of conductive metal has a resistivity of less than 1.8×10 −6 ohm-centimeters. It is preferred that each of the layer of conductive metal and the layer of metal oxide has a melting point of at least about 1,000 degrees centigrade.

In the printing process, it is desired to print a patterned layer of ceramic/dielectric "ink" over the metal/metal oxide material patterned onto the substrate. This printing process is well known to those skilled in the art and is described, disclosed, e.g., in U.S. Pat. Nos. 4,152,282 (silk screening of dielectric paste), 3,864,159, 4,865,875, 4,830,988, and 4,609,582. The disclosure of each of these patents is hereby incorporated by reference into this specification.

Figure 7:
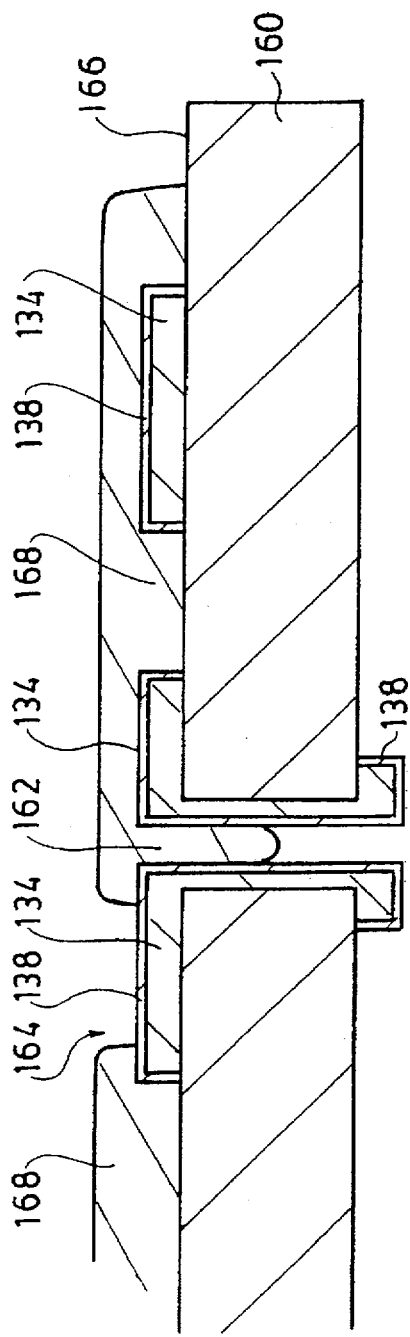

FIG. 7 is sectional view of a ceramic substrate 160 onto which layers of copper 134 have been selectively patterned in substantial accordance with the procedure of U.S. Pat. No. 5,058,799. In the embodiment depicted, the structure is comprised of a through-hole 162 formed by conventional means in substrate 160.

By the procedure described elsewhere in this specification, layers 138 of copper oxide are preferably formed over layer 134. Thereafter, layers of dielectric "ink" are selectively patterned over the structure.

As is known to those skilled in the art, in the screen printing process, the screen (not shown) is preferably patterned to prevent deposition of material in certain areas. Thus, referring to FIGS. 7 and 8, two such masked areas are areas 164 and 166.

Referring again to FIG. 7, it will be seen that a layer 168 of dielectric "ink" is selectively patterned onto the structure in the screen printing process. Thereafter, after drying, binder removal, and sintering, the layer of "ink" so deposited tends to shrink and conform to the shape of the surface onto which it was deposited.

In one embodiment, not shown, at least two layers of the dielectric "ink" are separately deposited, dried, processed to remove binder, and then sintered. In another embodiment, at least three layers of such dielectric "ink" are so deposited.

The dielectric ink used in the process is preferably deposited as a layer with a thickness of at least about 25 microns and, preferably, at least about from 25 microns to about 100 microns.

One may use the dielectric inks commonly used by thick film industry for printing printed circuits which are adapted for firing in nitrogen. As is known to those skilled in the art, nitrogen fireable dielectrics must balance hermeticity with the tendency to blister. This tendency is inherent in all dielectrics but is exacerbated by the need to burn out the dielectric delivery system with only 5–10 parts per million of oxygen present in the predominantly nitrogen atmosphere.

The dielectric ink used in the process of this invention is preferably a mixture of liquid material and solid material which preferably contains at least about 80 weight percent of solid material and at least about 10 weight percent of liquid material.

In one preferred embodiment, the liquid in the dielectric ink is preferably non-aqueous and preferably has a boiling point in excess of 100 degrees centigrade.

The viscosity of the dielectric ink used in the process, when measured with a Brookfield RVT viscometer and an ABZ spindle at 10 revolutions per minute and room temperature, is preferably less than 500 Pascals.

The solid material in the dielectric preferably has a particle size distribution such that at least about 95 percent (by weight) of such particles are smaller than 25 microns.

One especially preferred dielectric ink is "dielectric composition 4906" which is sold by Electro-Science Laboratories, Inc. of 416 East Church Road, King of Prussia, Pa. This material has a dielectric constant of from about 5 to about 11 and is insoluble in water. It is comprised of at least about 5 weight percent of liquid, and at least about 0.5 weight percent of organic binder, and at least about 80 weight percent of solid particulate matter; the solid particulate matter comprises glass and alumina. Substantially all of the particles of such ink are less than about 54 microns in size. The solid particulate matter liquefies and sinters at a temperature in excess of 800 degrees centigrade.

Yet another suitable dielectric ink is "Fodel 6050 Dielectric Paste," which is also sold by the E. I. dupont de Nemours & Company of Wilmington, Del. This material has a dielectric constant of from about 7 to about 9, a breakdown voltage in excess of 1,000 volts per 25 microns of thickness of dielectric, and an insulation resistance in excess of $10^{11}$ ohms at ambient temperature. When this dielectric is used to coat the substrate, it is preferred to fire it in nitrogen atmosphere comprised of water vapor; such atmosphere may be readily produced by bubbling an inert or relatively inert gas (such as nitrogen) through water maintained at a substantially constant temperature prior to flowing the inert gas over the heated substrate.

The aforementioned "Fodel . . ." material, in addition to being comprised of glass particles and organic solvent, also contains photosensitive plastic binder material which enables a user to expose the dried dielectric layer to ultraviolet radiation and to selectively harden certain areas thereof. Thereafter, the unexposed areas may be washed away prior to the firing of the binder removal step and the sintering step. This feature allows the patterning of fine features in the dielectric layer.

Referring again to FIG. 1, after a layer of dielectric material is applied to the structure, it is then passed via line 24 to dryer 26, wherein the solvent is removed. It is preferred that the temperature in dryer 22 be below the boiling point of the organic solvent in the dielectric ink. In one preferred embodiment, the structure is subjected to a temperature of less than about 150 degrees centigrade (and, more preferably, less than about 130 degrees centigrade) until substantially all of the solvent in the dielectric layer has evaporated.

In one embodiment, the steps of printing and drying are repeated at least once, and often at least twice, to provide several layers of the dried dielectric material. In one aspect of this embodiment, different dielectric materials are used in each of the printing/drying sequences to provide printed layers with different characteristics.

In one embodiment, a three-layer dielectric structure is produced with a substantially non-porous dielectric material on top, and relatively porous dielectric material in the middle, and a lower porosity dielectric material on the bottom.

In another embodiment, one layer of dielectric material is deposited, dried, and thereafter fired. Thereafter a second layer of dielectric material is deposited upon the first sintered layer, dried, and fired.

Referring again to FIG. 1, after a suitable number of dried layers of dielectric material have been produced, the structure is then passed via line 28 to binder removal furnace 30.

In prior art binder removal processes, it is often recommended that, when the structure contains copper, an atmosphere relatively low in oxygen be used to avoid the formation of oxides of copper. Applicants have found, however, that in their process the use of an oxygen-containing atmosphere (such as air, oxygen, mixtures thereof, and the like) effectively removes the organic binder without any substantial deleterious effects.

In applicants' process, thus, it is preferred to heat the structure in binder removal furnace 30 to a temperature of at least about 400 degrees centigrade (and, preferably, from about 400 to about 500 degrees centigrade) for from about 30 minutes to about 60 minutes. In this process, one preferably heats the structure from ambient to the 400–500 degree peak temperature over a period of from about 10 to about 20 minutes, holds the structure at the peak temperature for at least about 10 to 20 minutes, and then cools the structure to ambient over a period of from about 10–20 minutes. During each of these steps, it is preferred to contact the structure with flowing oxygen-containing gas.

The structure from which binder has been removed is then passed via line 32 to sintering furnace 34. Thereafter, the temperature of the structure is raised from ambient to a peak temperature of from about 800 to about 950 degrees Centigrade over a period of at least about 20 minutes and preferably from about 20 to about 40 minutes; during this portion of the firing, the structure is contacted with flowing inert gas containing less than about 100 parts per million of oxygen.

Once the peak temperature has been reached, the structure is maintained at this temperature for at least 3 minutes (and, preferably, from about 3 to about 15 minutes) while contacting the structure with inert gas containing less than about 100 parts per million of oxygen). Thereafter, the structure is cooled to ambient over a period of at least about 10 minutes (and, preferably, at least about 20 minutes).

Figure 8:
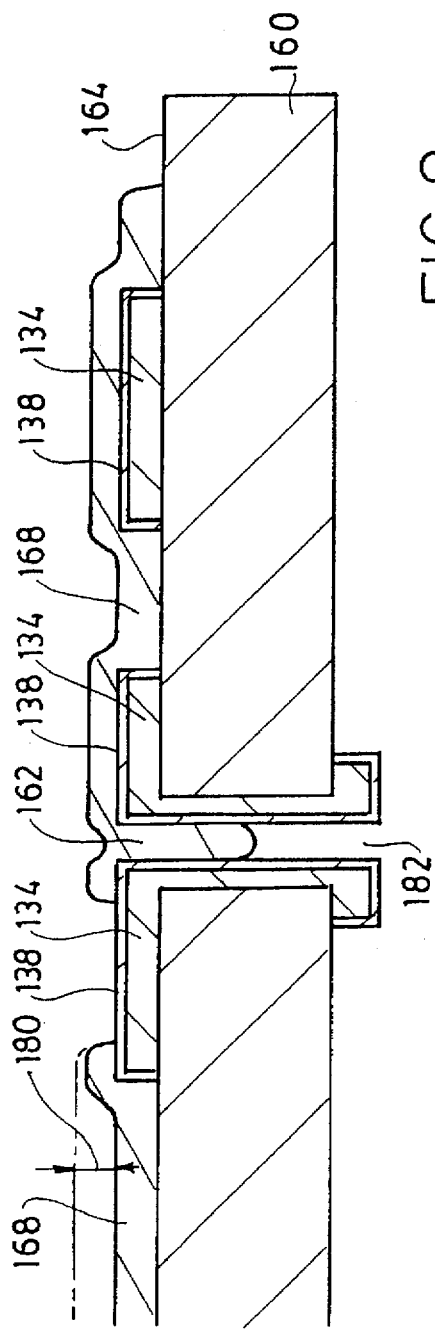

Without wishing to be bound to any particular theory, applicants believe that the production of the metal oxide layer in oxidizer 18 affords better adhesion between the metal/metal oxide and the glass dielectric; thus, the fired dielectric material tends to adhere better to the metal/metal oxide structures (see FIG. 8).

Referring to FIG. 8, the shrinkage which occurred with dielectric 168 may be determined by comparing it with the wet-printed dielectric surface (see FIG. 7).

Referring again to FIG. 8, the sintered structure will have certain of its copper/copper oxide areas exposed after the sintering. Thus, e.g., areas 180 and 182 are two of such unmasked areas.

In the metal oxide removal step 38, the metal oxide layer 138 is removed, preferably by chemical means. The structure is preferably dipped into a metal oxide etchant which will attack the metal oxide preferentially but will not attack the sintered dielectric or the copper or the substrate 160 to any appreciable extent.

In one preferred embodiment, the structure is dipped into an aqueous solution of hydrochloric acid at a concentration of from about 10 to about 50 volume percent. It is preferred to use hydrochloric acid at a concentration of from about 15 to about 30 volume percent.

The hydrochloric acid may be used at ambient temperature. Alternatively, it may be at a temperature of from about 40 to about 80 degrees centigrade.

Instead of hydrochloric acid, or in addition thereto, one may use other conventional etchants which selectively attack the metal oxide.

The metal oxide removal is time and temperature dependent. The structure is contacted with the removal agent for a time sufficient to remove substantially only the metal oxide.

The structure with the metal oxide removed from it is shown in FIG. 9. See areas 184 and 186 which now present bare metal. This bare metal may now be treated in a surface preparation step, and thereafter additional metal may be added thereto in an electroless metal deposition step.

In one preferred process, the dielectric ink used is a mixture of the aforementioned "dielectric composition 4906" and "Fodel 6050 . . ." materials.

In one preferred embodiment, the dielectric ink is comprised of glass. These glass-containing dielectric materials are well known to those skilled in the art and are described, e.g., in U.S. Pat. Nos. 4,152,282 (aluminum oxide and a borosilicate glass), 4,830,988 (magnesium-barium-aluminum-zirconium-borophosphosilicate glass frit and an organic vehicle), 4,865,875 (glass microspheres and a organic vehicle), 4,861,646 (borosilicate glasses and crystalline fillers), 4,855,266 (a high-K dielectric composition containing doped barium titanate and glass-forming ions that can be co-fired in a low-oxygen containing atmosphere), 4,849,380 (a low K dielectric composition consisting of amorphous borosilicate glass containing alumina, a mixture of oxides of alkali metals and alkaline earth metals, and a ceramic filler), 4,849,379, 4,152,282 (aluminum oxide and borosilicate glass), and the like. The entire disclosure of each of these patents is hereby incorporated by reference into this specification.

In one preferred embodiment, the dielectric ink is comprised of cordierite ($2MgO.2Al_2O_3.5SiO_2$), which is a material with a low (about 3–4) dielectric constant. In another preferred embodiment, the dielectric ink is made from glass compositions based on such magnesium oxide, alumina, and silica and, additionally, phosphorous pentoxide and boron oxide.

The structure, and its exposed surfaces, are now subjected to the acid etching process described in U.S. Pat. Nos. 5,100,714 of 5,058,799; see, e.g., columns 11 and 12 of U.S. Pat. No. 5,058,799. In one preferred embodiment, a ceramic blank is preheated to a temperature of about 93 degrees centigrade for approximately five to ten minutes and then dipped into a hot, concentrated acid dip to etch the ceramic surface along the ceramic grain boundaries thereof.

The acid etched structure is then passed via line 44 to electroless metal deposition step 46 in which electroless metal deposition occurs. This electroless deposition may occur by conventional means such as, e.g., by one or more of the processes disclosed in U.S. Pat. Nos. 5,102,456 (copper), 5,075,037 (copper), 5,066,545 (nickel), 5,024,680 (nickel), 4,971,944 (gold), 4,935,013 (copper/nickel alloy), 3,650,747 (cobalt), and the like; the disclosure of each of these patents is hereby incorporated by reference into this specification.

By way of further illustration, and not limitation, one may use the electroless deposition process described in U.S. Pat. Nos. 5,100,714 and 5,058,799.

The structure produced as a result of this electroless plating is illustrated in FIG. 9A. Referring to FIG. 9A, it will be seen that a thin layer 187 of electroless copper covers the structure.

Thereafter, photoresistive coating applied in step 50. One may use any of the photoresistive coatings known to those in the art. Thus, by way of illustration and not limitation, one may use one or more of the photoresistive coatings described in U.S. Pat. Nos. 5,100,508, 5,094,884, 5,092,968, 5,077,176, 5,069,996, 5,066,561, 5,064,746, 5,057,401, 5,055,318, 5,055,383, 5,045,485, 5,039,594, 5,037,482, 5,027,062, 5,021,320, 5,019,488, and the like. The disclosure of each of these United States patents is hereby incorporated by reference into this specification.

In one embodiment of this process, a film of photosensitive resist material is applied to the exterior surfaces of structure 189 (see FIG. 9A). Thus, by way of illustration and not limitation, in step 50, a sheet of "DYNACHEM" photoresistive dry film (manufactured by the Thiokol/Dyachem Corporation of Tustin, Calif.) may be applied by conventional means. Thus, e.g., this film may be applied by means of a "MODEL 300 LAMINATOR" manufactured by such Thiokol/Dynachem Corporation.

Figure 10:
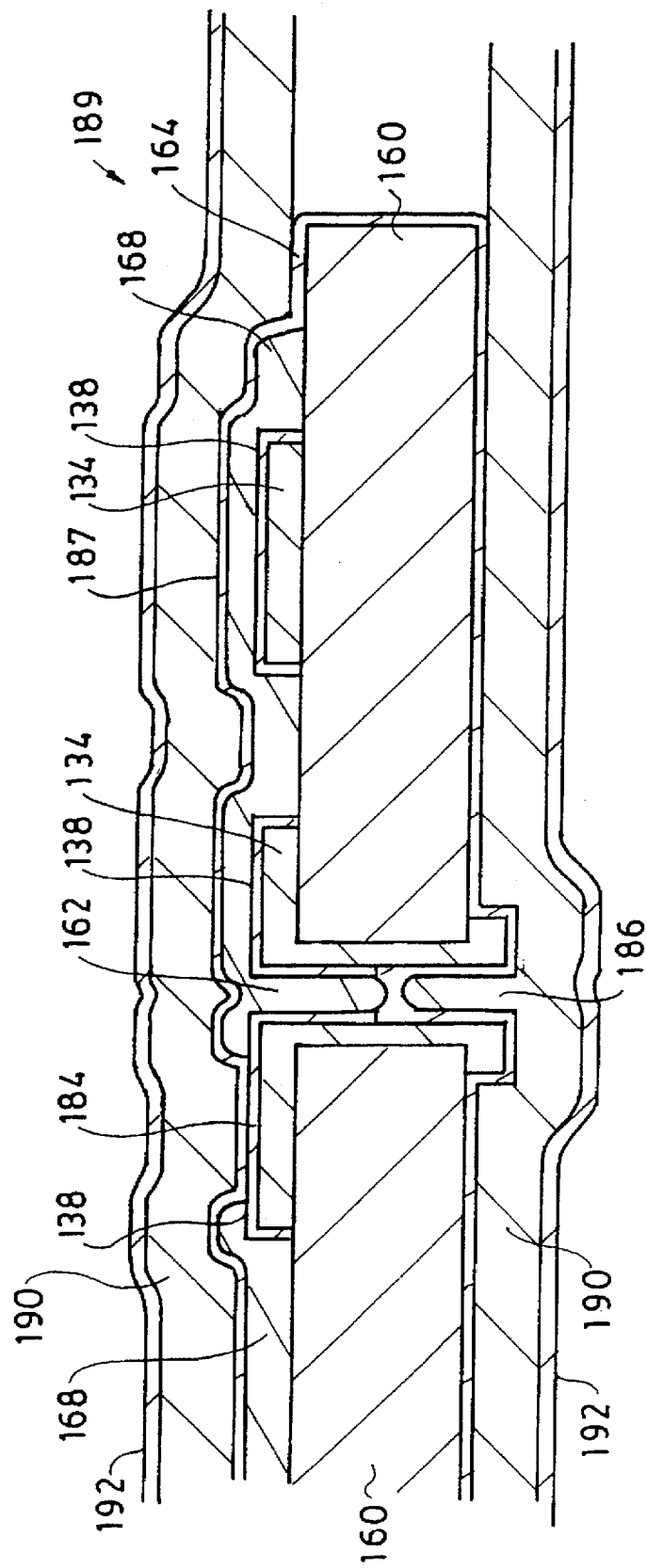

FIG. 10 is view of the structure of FIG. 9A to which a layer of photoresistive film 190 has been applied. As will be seen from such FIG. 10, attached to photoresistive film 190 is a removable layer of carrier film 192, which is removed prior to development.

Figure 11:
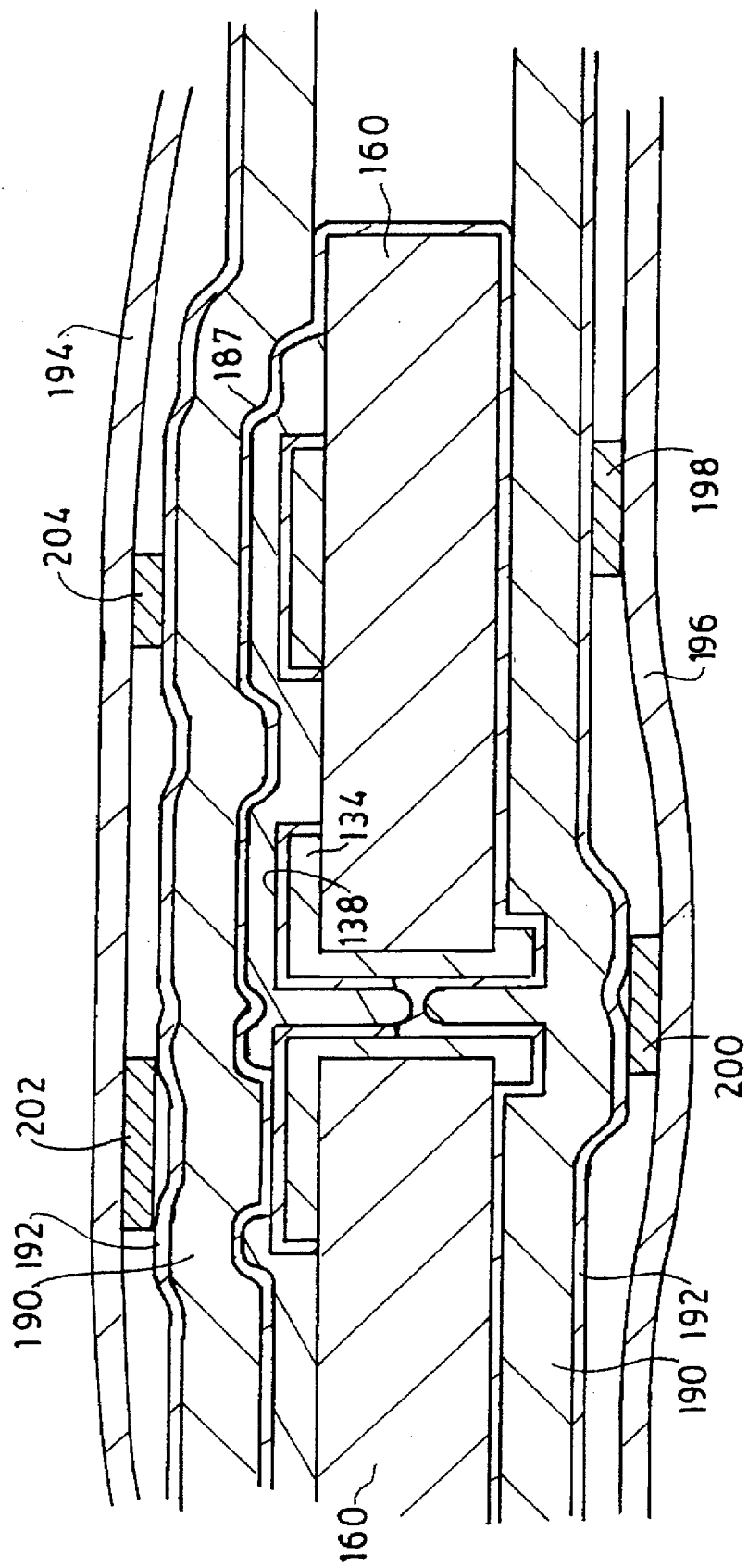

Thereafter, a mask with the desired pattern is placed over film 190 and/or over film 192; see FIG. 11. Referring to FIG. 11, mask segments 194 and 196 will tend to block the transmission of ultraviolet light in dark masked areas 198, 200, 202, and 204.

The masked structure is then exposed to ultraviolet radiation. Thus, e.g., one may use a model 39 ultraviolet exposure device manufactured by the Hybrid Technology Corporation of Campbell, Calif. As will be apparent to those skilled in the art, ultraviolet radiation will be transmitted through the masks in every area except for masked segments 198, 200, 202, and 204; and, consequently, the areas in which such radiation is transmitted will cause the corresponding areas of photoresistive film disposed underneath them to polymerize. Such polymerized areas are resistant to degradation by the developer subsequently used.

If not already heretofore done, the carrier film 192 is removed form the photoresistive material 190. Thereafter, the exposed structure is contacted with a developer which tends to dissolve those areas of film 190 which have not polymerized. Thus, e.g., the areas of film 190 underneath masks 198, 200, 202, and 204 will be removed by the developer.

Any conventional developer which selectively removes unpolymerized photoresistive film may be used in this process. By way of illustration and not limitation, one may use aqueous sodium bicarbonate.

Figure 12:
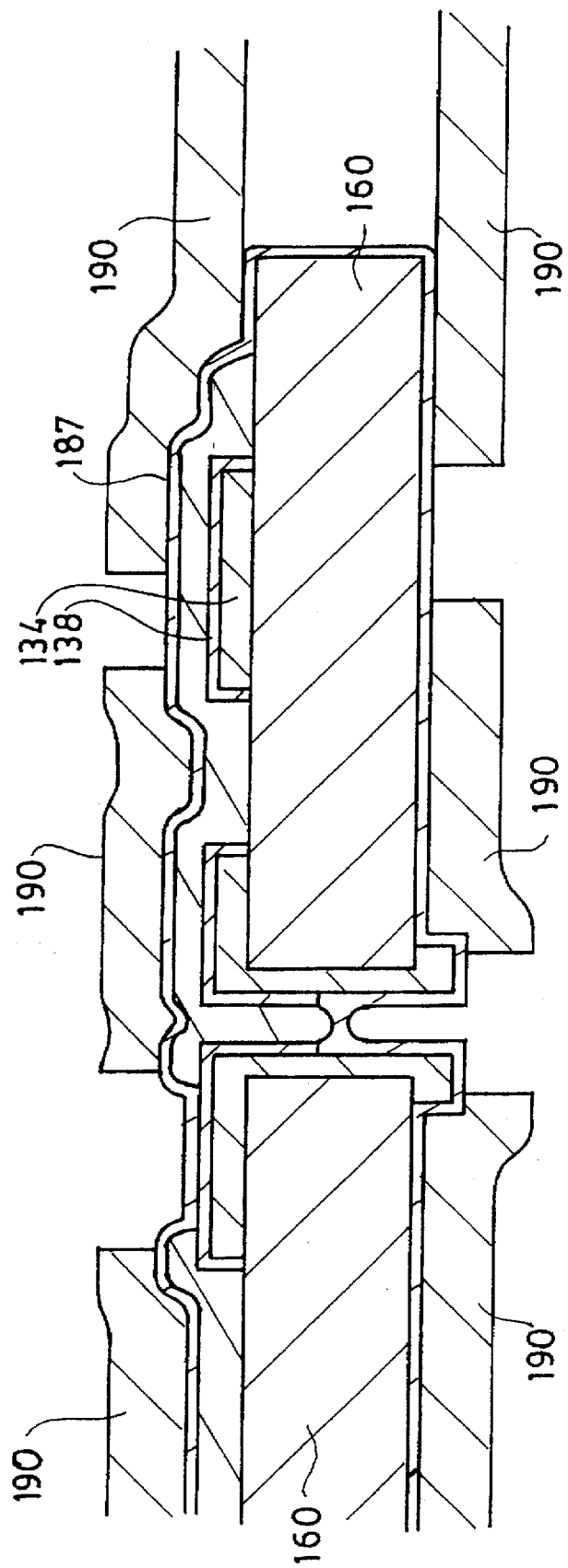

FIG. 12 shows the product produced after the exposure of the substrate to developer 58. Note that, where the masks 198, 200, 202, and 204 had been disposed over the structure (see FIG. 11), the photoresistive material has been removed. This open areas now can be built up further with the deposition of electroplated metal in metal plater 62.

The electroplating operation is well known to those skilled in the art and may be conducted, e.g., in substantial accordance with the procedure of one or more of U.S. Pat. Nos. 5,108,554, 5,108,552, 5,106,537, 5,104,563, 5,103,637, 5,102,521, 5,102,506, 5,101,682, 5,100,524, 5,098,860, 5,098,544, 5,098,542, 5,096,522, 4,094,726, and the like. The disclosure of each of these United States patents is hereby incorporated by reference into this specification.

Figure 13:
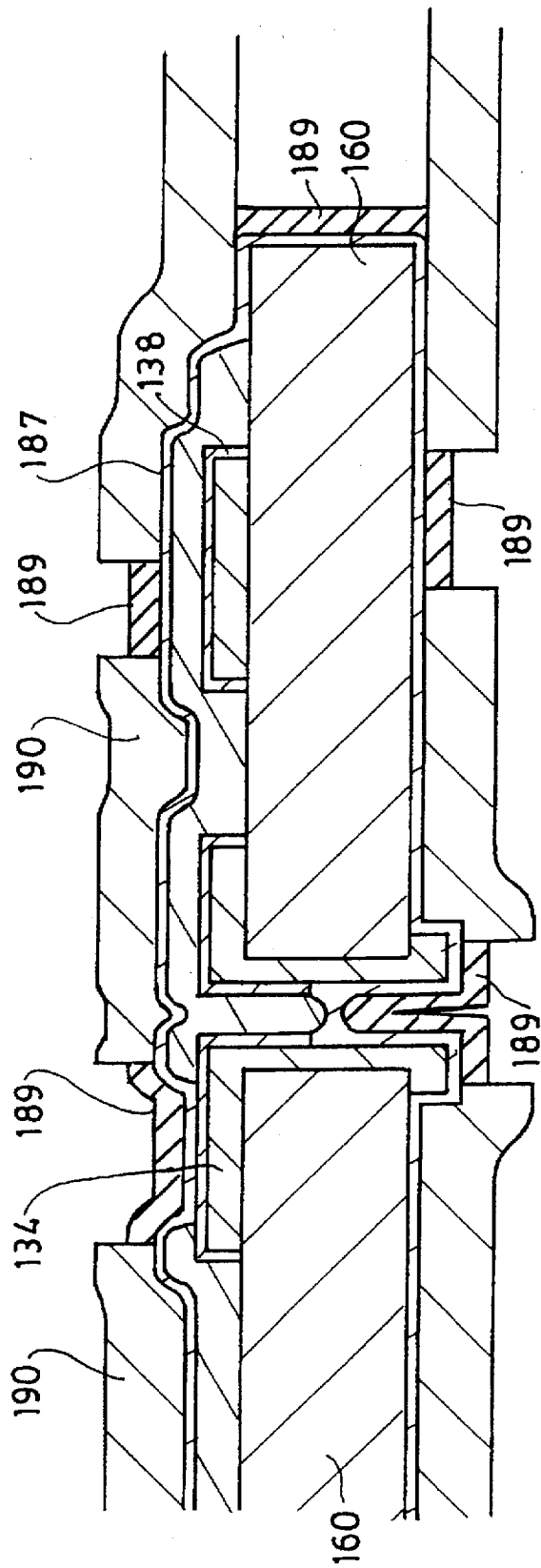

The product produced is metal plating step 62 is illustrated in FIG. 13. Note the presence of the layer 189 of electroplated metal.

Figure 14:
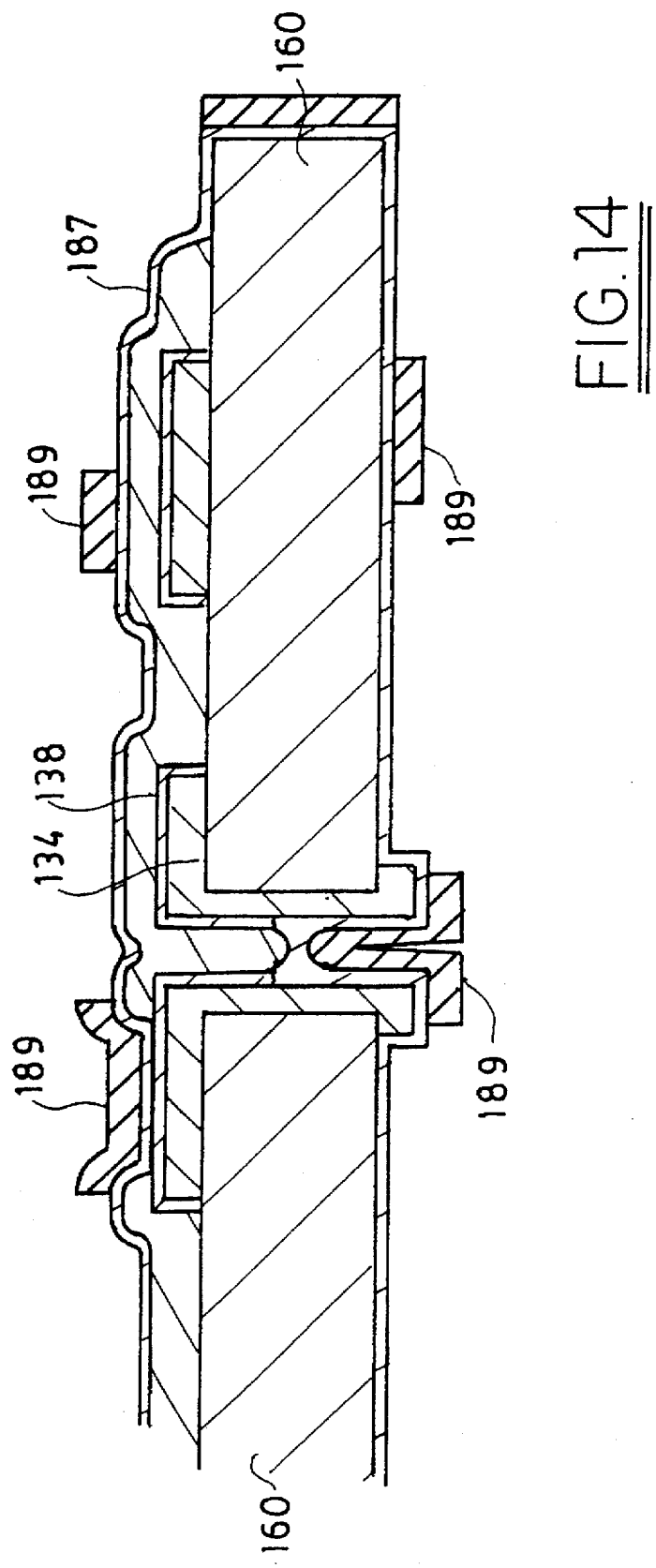

The structure is then passed via line 64 to photoresist stripper 66, wherein photoresistive film 190 is removed. The product produced is illustrated in FIG. 14.

Photoresist stripping compositions, and processes and apparatuses for their use, are well known to those skilled in the art and are disclosed, e.g., in U.S. Pat. Nos. 5,102,777, 5,091,103, 4,992,108, 4,963,342, 4,917,122, 4,824,763, 4,791,043, 4,744,834, 4,718,974, 4,491,530, 4,483,917, 4,438,192, and the like. The disclosure of each of these United States patents is hereby incorporated by reference into this specification.

The structure is then passed via line 68 (see FIG. 1) to electroless metal removal step 70, wherein the electroless metal is removed by conventional means by preferably contacting it with an etchant capable of removing the metal. Thus, e.g., one may contact the structure with an aqueous solution of potassium persulfate which removes the relatively thin layer of electroless metal (such as copper) but leaves the remainder of the structure relatively unaffected. Alternatively, or additionally, one may use conventional metal etchants well known to those skilled in the art.

By way of illustration and not limitation, one may use one or more of the metal etchants disclosed in U.S. Pat. Nos. 5,064,500, 5,053,105, 5,034,093, 5,030,323, 5,001,085, 4,996,133, 4,902,607, 4,849,067, 4,747,907, 4,345,969, 3,520,746, and the like. The disclosure of each of these United States patents is hereby incorporated by reference into this specification.

The structure produced after the electroless metal removal step is illustrated in FIG. 15. Note that, comparing this structure with FIG. 7, an additional layer of sintered dielectric and metal has been added to the structure of FIG. 7. As will also be apparent to those skilled in the art, this process may be repeated indefinitely to add additional patterned layers of dielectric and metal. Alternatively, or additionally, the structure may be passed via line 71 to machiner 73, wherein desired machining operations may be performed. Thus, for example, end portions 220 and 222 may be cut at lines 224 and 226 as shown in FIG. 16.

The following example is presented to illustrate the claimed invention but is not to be deemed limitative thereof. Unless otherwise specified, all parts are by weight, and all temperatures are in degrees centigrade.

EXAMPLE 1

Figure 17:
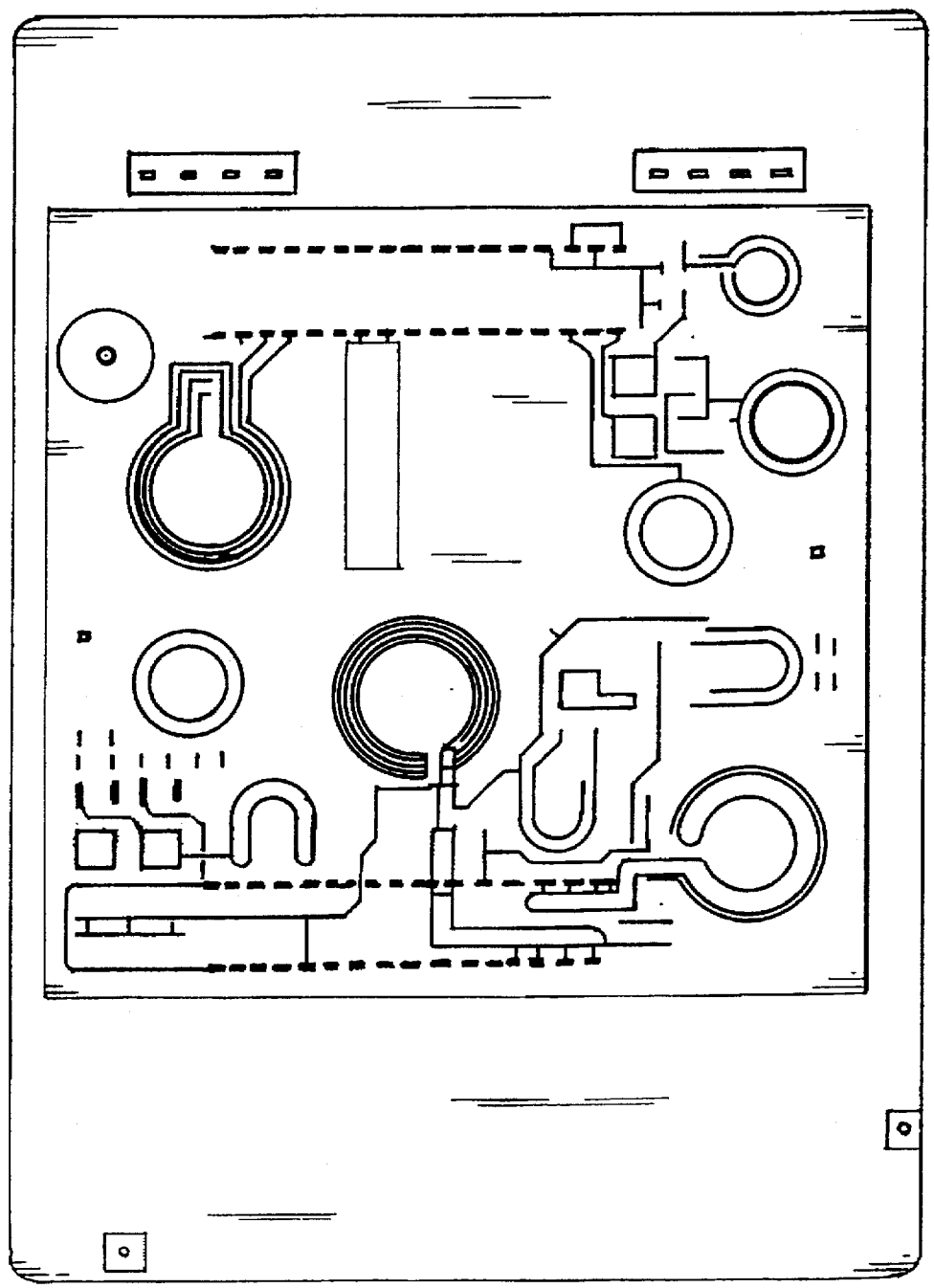
FIG. 17 is a top view of a mask used to prepare a conductor pattern on a ceramic substrate.

In substantial accordance with the procedure of U.S. Pat. No. 5,058,799, a metallized substrate was produced on a 4.5"×6.5" white alumina blank which was 0.025 inches thick and contained patterned copper on each of its top and bottom surfaces which was 0.002 inches thick. The copper pattern used on the top surface of the substrate is illustrated in FIG. 17.

The metallized alumina substrate was heat treated in a conveyor furnace, model number 14CF-154S, which was manufactured by the Watkins-Johnson Company of Scotts Valley, Calif.

In the first stage of the heat treatment, while the substrate was conveyed through the furnace, it was contacted with nitrogen which flowing at a rate of 5 cubic feet per minute; during this stage, less than 10 parts per million of oxygen were detected in the furnace environment. In this first stage, the substrate was heated from ambient to a temperature of 900 degrees centigrade over a period of 45 minutes. Thereafter, the substrate was maintained at the 900 degrees centigrade temperature for ten minutes. Thereafter the substrate was cooled to ambient over a period of 30 minutes.

The cooled substrate was then run through the same conveyor furnace. It was heated from ambient to a temperature of 900 degrees centigrade over a period of 45 minutes while being contacted with nitrogen flowing at a rate of 5 cubic feet per minute; during this time, the nitrogen contained less than ten parts per million of oxygen.

Once the 900 degree centigrade temperature was reached, the atmosphere was changed to a mixture of nitrogen at 200 parts per million of oxygen. The substrate was subjected to the 900 degree centigrade temperature for ten minutes while being contacted with the flowing gas mixture at a rate of 5 cubic feet per minute.

Thereafter, the atmosphere was changed to nitrogen containing less than 10 parts per million of oxygen and flowing at 5 cubic feet per minute. The substrate was cooled from the 900 degree centigrade temperature to ambient over a period of 30 minutes.

Figure 18:
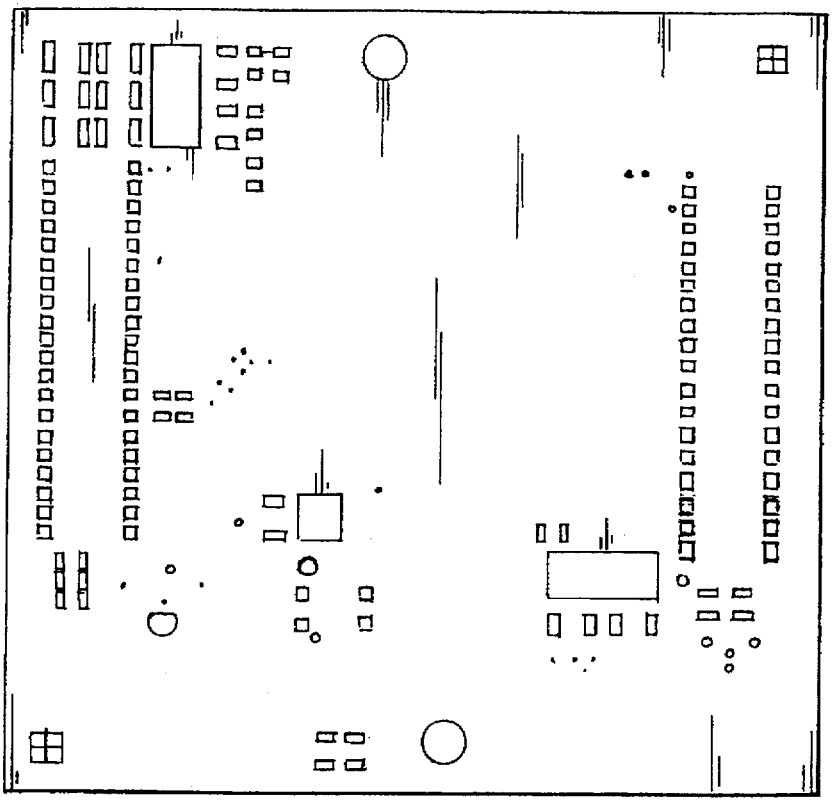
FIG. 18 is a top view of a mask used to prepare a dielectric pattern.

A dielectric pattern was screen printed on top of the top surface of metallized substrate; the pattern used is depicted in FIG. 18.

The dielectric ink used was prepared from "Type 4906 dielectric composition," which is sold by the Electro-Sciences Laboratories, Inc. of 416 East Church Road, King of Prussia, Pa. 50 grams of this material were diluted with 4 drops of "Type 401 Thinner," which is also sold by such Electro-Sciences Laboratories Company.

3.0 grams of the diluted dielectric ink were used to screen print the substrate. The screen printer used was a model CP-885 Screen Printer, which is sold by the Presco Division of Affiliated Manufacturers, Inc., U.S. Route 22, P.O. Box 5049, North Branch, N.J.

The substrate to be printed was disposed under a 12"× 12" frame with a 200 mesh metal stainless steel screen. The dielectric was manually forced through the screen pattern with a trailing edge squeegee applied at an angle of 20 degrees. Prior to each pass, the screen was covered with dielectric in a "flood stroke". One pass in each direction was made with the squeegee.

The substrate was then allowed to stand while in a horizontal position in air for 10 minutes in a light-free environment.

Thereafter the substrate was placed on the bottom heated plate, at a temperature of 250 degrees Fahrenheit, which was part of a Dake Corporation model 44183 press and maintained on said plate for 20 minutes. Thereafter it was removed from the heated plate and allowed to cool.

The cooled substrate was then returned to the Screen Printer, and an intermediate layer of dielectric material was applied to it in the manner described above. The intermediate dielectric material, however, was a 50/50 mixture of Ferro 10-008 "nitrogen fireable dielectric paste" (manufactured by the Ferro Corporation of 27 Castillian Drive, Santa Barbara, Calif.) and of duPont's Q-Plus QP445 dielectric paste (manufactured by the E.I. dupont deNemours and Company of Wilmington, Del.). After the intermediate dielectric material was applied in the aforementioned matter, it was allowed to stand in a dark atmosphere for ten minutes and thereafter dried on the Dake hot plate.

Thereafter, a third layer of dielectric material was applied and dried in exactly the same manner as the first layer, using precisely the same composition.

The dried substrate was then placed into another Watkins-Johnson conveyor furnace and, while in air, raised from ambient temperature to a temperature of 500 degrees centigrade over a period of 60 minutes, maintained at 500 degrees centigrade for 30 minutes, and then cooled to ambient over a period of 15 minutes.

The substrate was then charged to the first Watkins-Johnson conveyor furnace and, while being contacted with nitrogen (and less than 10 parts per million of oxygen) flowing at a rate of 5 cubic feet per minutes, raised from ambient to 900 degrees centigrade over a period of 45 minutes, maintained at a temperature of 900 degrees centigrade for 10 minutes, and cooled to ambient over a period of 30 minutes.

The sintered substrate was then treated to remove sintered dielectric from the substrate. About 100 tiny (0.007 inch diameter) through holes were drilled by a laser through the dielectric to expose the layer of copper underneath such dielectric. These through holes were drilled in those areas of the structure where connection was to be made to the copper pattern.

The substrate was then rinsed with hot water for five minutes. Thereafter it was dipped into methanol for two minutes, and thereafter into acetone for 1 minute.

The substrate was then allowed to air dry for 5 minutes. Thereafter, it was dipped into a 50/50 mixture (by volume) of 36.5 volume percent hydrochloric acid and water; and it was allowed to stand in this solution for 3.0 minutes.

The substrate was then removed from the solution of hydrochloric acid and rinsed with water. Thereafter, the substrate was blown dry with air over a period of 30 seconds.

The dried substrate was then dipped into a solution of "ALCONOX" (a detergent sold by Alconox, Inc. of New York, N.Y.) for two minutes. Thereafter, the substrate was rinsed with water.

The substrate was then dipped into an 85 percent solution of phosphoric acid (sold by Chemical Distributors, Inc. of Buffalo, N.Y.) for thirty seconds. Thereafter, the substrate was rinsed with water.

38 pounds of ammonium bifluoride flake (sold by the Chemtech Products Company of 3500 Missouri Avenue, Alorton, Ill.) were mixed with 5,160 milliliters of 48 percent fluoroboric acid (sold by the General Chemical Company). The substrate was dipped into this mixture for 30 seconds and, thereafter, rinsed with water.

The substrate was dipped into a 5 volume percent solution of sodium hydroxide for three minutes and thereafter rinsed in water.

A mixture of 1,376 milliliters of "Neoganth B" (a liquid comprised of sodium hydrogen sulfate solution and sold by the Atotech Company of Pa.), 35 milliliters of 98 percent sulfuric acid, and 24 gallons of water was prepared. A portion of this mixture was disposed in a small container, and the substrate was dipped into this mixture for 12 minutes.

Thereafter, the substrate was dipped into solution of "Neoganth 834," a palladium-ion containing solution sold by such Atotech Company for four minutes. The substrate was then rinsed twice in water.

A solution of 310 grams of boric acid powder, 24 gallons of water, and 275 milliliters of "AA reduction solution" (sold by such Atotech Company), and 24 gallons of water, was prepared. A portion of this solution was transferred to a beaker, and the substrate was dipped into this for 1 minute A solution of 138 grams of boric acid, 28 grams of said "AA reduction solution"), and 24 gallons of water was prepared. A portion of this solution was transferred to a beaker, and the substrate was dipped into it for 1 minute.

An "electroless plating solution" for depositing copper was prepared by mixing 2,520 milliliters of "NOVII-GANTH HC Makeup Solution" (sold by the Chemcut Company of 45 South Street, Hopkinton, Mass.), 36 milliliters of "NOVINGANTH HC Stabilizer" (sold by such Chemcut Company), 900 milliliters of "rayon grade" liquid caustic soda (sold by the Chemical Distribution, Inc. company of Buffalo, N.Y.), and 1,350 milliliters of "Reduction Solution Copper" (a formaldehyde preparation sold by the Atotech company of Pennsylvania. This mixture was then mixed with 50 gallons of water to make up the electroless bath.

800 milliliters of this bath were transferred to a large beaker and heated to a temperature of about 80 degrees centigrade. Thereafter, the substrate was dipped into this bath and maintained there for one hour.

The substrate was then removed from this bath, rinsed with water, and then dipped into a citric acid solution which was made from a mixture of 380 grams of citric acid, 690 milliliters of 98% sulfuric acid, and 24 gallons of water. A portion of this solution were transferred to a large beaker, and the substrate was dipped into it and maintained therein for four minutes.

Thereafter, a film of photosensitive resist material was applied to the top and bottom surfaces of the substrate. A sheet of "DYNACHEM" photoresistive dry film (manufactured by the Thiokol/Dyachem Corporation of Tustin, Calif.) was applied by means of a "MODEL 300 LAMINATOR" manufactured by such Thiokol/Dynachem Corporation to such top and bottom surfaces.

Figure 19:
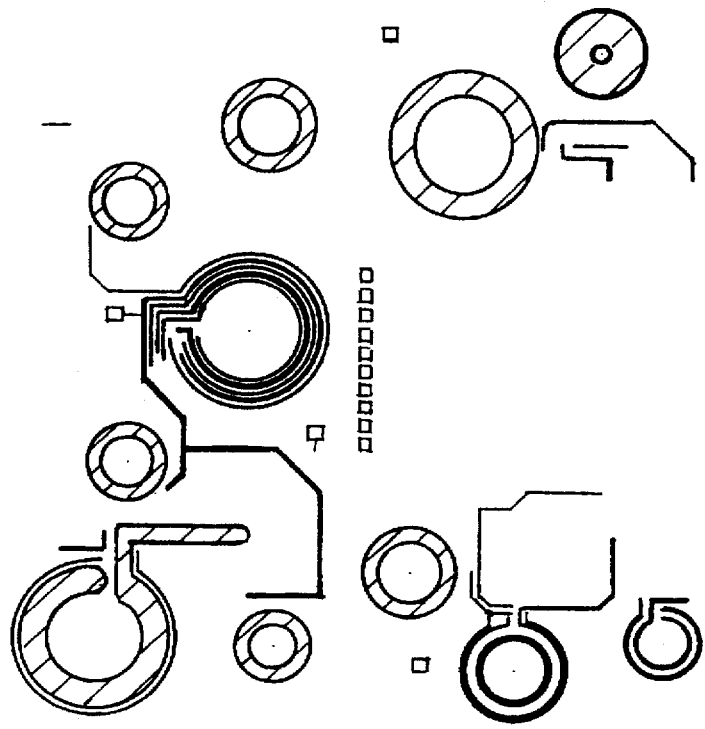
FIG. 19 is a top view of the top conductor pattern produced during one stage and in,one preferred embodiment of applicant's process.

Thereafter, a mask with the pattern depicted in FIG. 19 was aligned over the top surface of the substrate and the photosensitive film. The masked structure was then exposed to ultraviolet radiation in a model 39 ultraviolet exposure device manufactured by the Hybrid Technology Corporation of Campbell, Calif.

Thereafter, the unmasked bottom surface of the substrate was exposed to ultraviolet radiation.

The carrier film was then manually removed from the photoresistive material. Thereafter, the exposed substrate was exposed to potassium carbonate developer. One part, by volume, of "DEVCONC 11-A" (which is sold by the RBP Chemical Corporation) was mixed with 33 parts of water, and this developer was used in a "CHEMCUT SYSTEM 547" apparatus run at a speed of 2 feet per minute, at temperature of 85 degrees Fahrenheit, and a top and bottom pressure of 15 pounds per square inch to spray both sides of the substrate and wash out the unexposed photoresistive material in the pattern.

The developed substrate was then rinsed in water and dried.

A cleaning solution was made up in a rectangular tank (which was 12"×36"×34") containing 5 gallons of "DYNACHEM CLEANER LAC-81" (sold by Morton Electronics Materials, 2631 Michelle Drive, Tustin, Calif.) and sufficient deionized water to fill such tank. This solution was heated to a temperature of 120 degrees Fahrenheit, and the substrate was dipped into this solution for 4 minutes.

The substrate was then dipped into a tank containing hot water at a temperature of 85 degrees Fahrenheit and kept there for four minutes. Thereafter, the substrate was dipped into a tank of hot running water at 85 degrees Fahrenheit and maintained there for 5 minutes.

5 gallons of 98% sulfuric acid were mixed with a sufficient amount of deionized water to fill a rectangular tank which was 12"×36"×34". The substrate was then momentarily dipped into this solution.

An electroplating bath was prepared by mixing deionized water, 10 volume percent of 98 percent sulfuric acid (obtained from Chemical Distributors Inc.), and 10 volume percent of a solution of reagent grade copper sulfate, which was made by mixing 2.2 pounds of copper sulfate (obtained from Chemical Distributors Inc.) with a gallon of water.

The substrate was electroplated using the aforementioned bath in an electroplating apparatus which moved the substrate back and forth while in the bath, bubbled air through the bath, and delivered 0.54 volts and an amperage of 10 amperes per square foot of the area of to be plated on the substrate. The substrate was plated for one hour, and a layer of copper approximately 0.001 inches thick was deposited.

The substrate was then removed from the bath, rinsed in deionized water, and blow dried. Thereafter it was heated to a temperature of 150 degrees Fahrenheit in air and maintained under these conditions for one hour.

The substrate was then dipped into a solution of photoresistive stripping solution. One gallon of "DYNACHEM ALKASTRIP SQ-1" was charged into a rectangular tank (12"×36"×21") with sufficient water to fill the tank, and the solution was heated to a temperature of 135 degrees Fahrenheit. The substrate was maintained in this hot solution for sixty minutes and thereafter removed, rinsed with water, and dried.

An electroless copper removal solution was then prepared by mixing 55 pounds of sodium persulfate, 1,750 milliliters of 85 percent phosphoric acid, and 35 gallons of water. This solution was heated to a temperature of 118 degrees Fahrenheit. The substrate was exposed to this solution in the aforementioned CHEMCUT SYSTEM 547 at a pressure of 15 pounds per square inch and a rate of 2 feet per minute.

Figure 20:
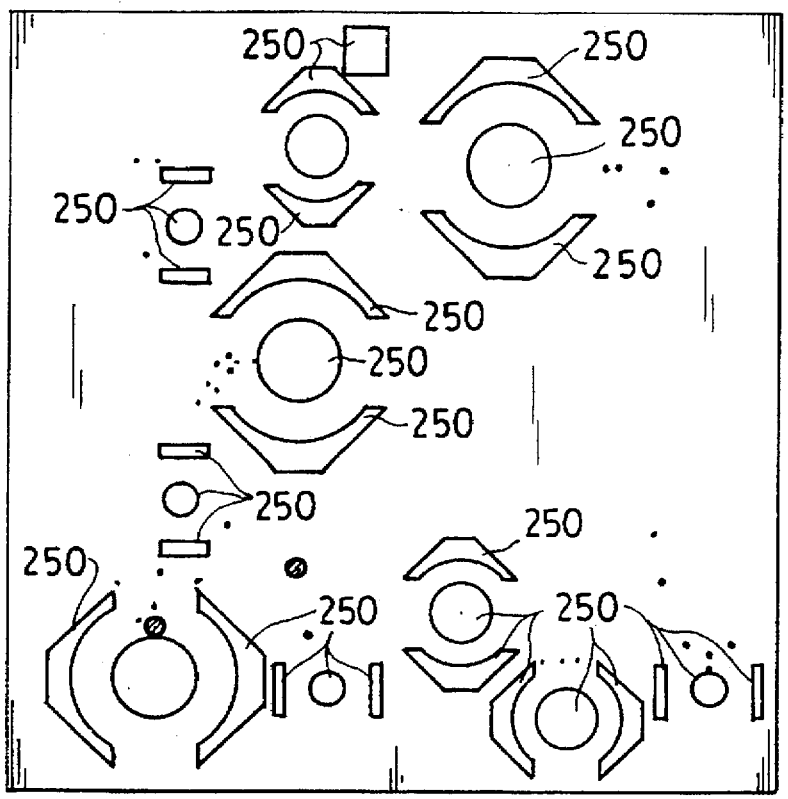
FIG. 20 is a top view of the areas to be machined in one device made in accordance with applicants' process.

The substrate was then machined so that areas 250 (see FIG. 20) were cut through by a laser machining device.

A ferrite pot core, manufactured as model number 2123 by the TDK Corporation of Japan, was pressed through openings 250. The structure thus produced had the appearance illustrated in FIG. 21.

Figure 21:
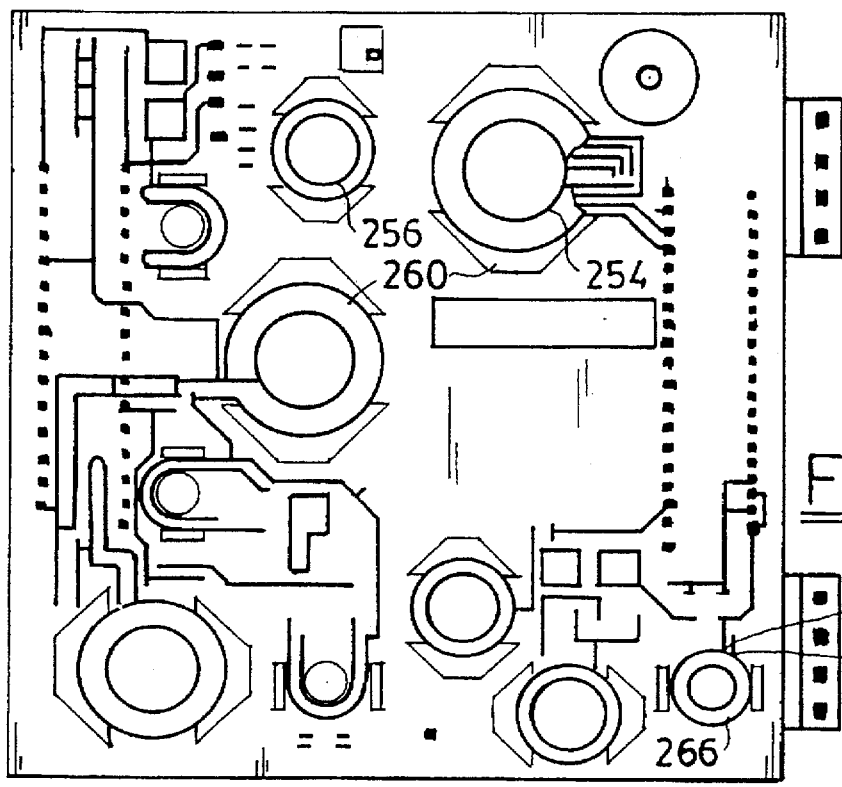
FIG. 21 is a top view of a planar transformer made in accordance with applicants' process.

The device depicted in FIG. 21 contains several transformers and several inductors. Referring to FIG. 21, one lead may be attached to coil 254, another lead may be attached to coil 256, and these coils maybe used as the primary and the secondary of a transformer (or vice versa). The ferrite core 260 improves the performance of the planar transformer.

Another portion of the substrate may be used as a planar inductor, with lead 262 and lead 264 being connected to planar inductor 266.

It is to be understood that the aforementioned description is illustrative only and that changes can be made in the apparatus, in the ingredients and their proportions, and in the sequence of combinations and process steps, as well as in other aspects of the invention discussed herein, without departing from the scope of the invention as defined in the following claims.

The Multichip Module of this Invention

Figure 22:
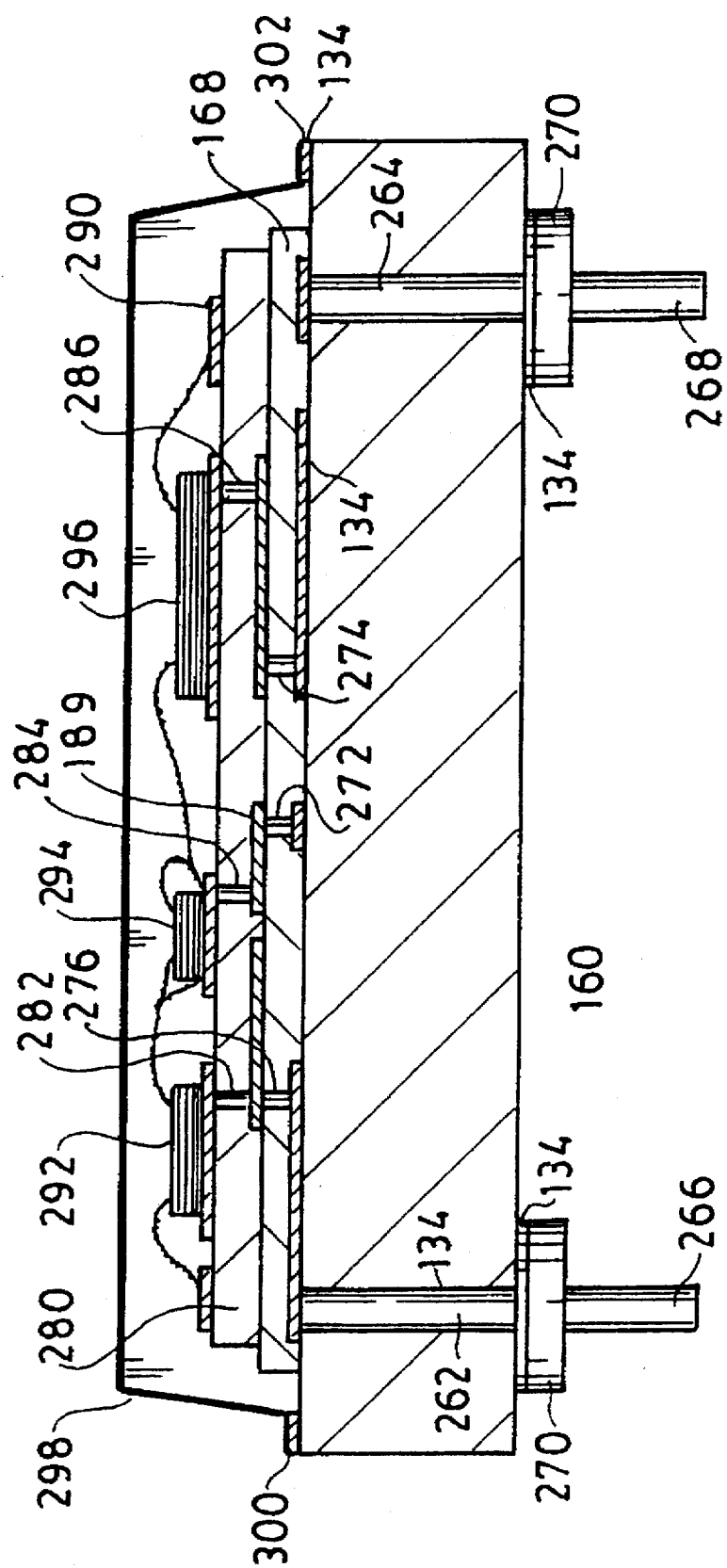
FIG. 22 is a sectional view of a multichip module made in accordance with applicants' process.

Thus, by way of further illustration, the procedure of Example 1 may be substantially repeated to produce the multichip module shown in FIG. 22. As will be appreciated by those skilled in the art, the multichip module depicted in FIG. 22 is only one of many such modules which may incorporate applicant's novel structure. Other such module designs which may be modified to incorporate applicants' structure include, e.g., the multichip modules described in U.S. Pat. Nos. 5,104,324, 5,091,769, 5,075,765, 5,072,874, 5,061,988, 5,034,568, 4,964,737, 4,890,156, 4,836,434, 4,698,662, 4,446,477, 4,103,318, and the like. The disclosure of each of these United States patents is hereby incorporated by reference into this specification.

Referring again to FIG. 22, and in the preferred embodiment illustrated therein, the substrate 160 is alumina with a thickness of 0.040 inches, vias 262 and 264 have been drilled in the substrate to provide connection for pins 266 and 268 brazed with solder 270 to copper 134, the first layer of dielectric material 168 is a glass-ceramic composition in which blind vias 272, 274, and 276 have been cut by laser machining, the next layer of copper 189 is formed on top of the dielectric and in the blind vias, the second layer of dielectric material 280 is then deposited and processed as described in Example 1, blind vias 282, 284, and 286 are formed in this second layer of dielectric, a third layer of copper 290 is deposited as described in Example 1, and semiconductor integrated circuitry 292, 294, and 296 is then attached using conductive adhesive. Wire bonds are then made connecting the integrated circuitry to the multilayer ceramic substrate. The entire circuit is then enclosed with a protective cover 298, which is shown in the Figure section attached by solder at points 300 and 302.

An Electromechanical Valve

Figure 23:
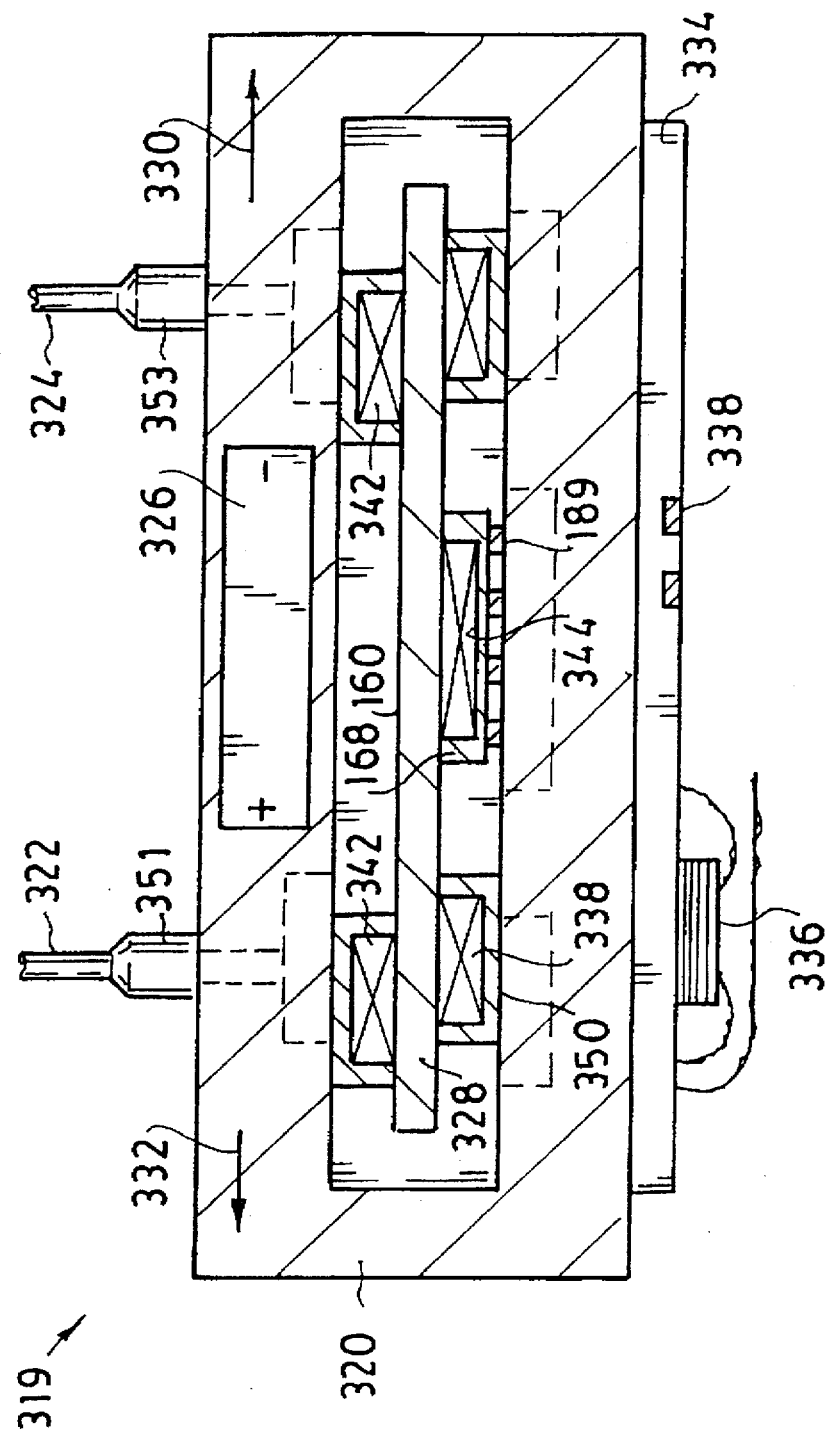
FIG. 23 is a sectional view of a hydraulic valve made in accordance with applicants' process.

By way of further illustration, an electromechanical valve may be prepared in substantial accordance with the procedure of Example 1 and FIG. 23.

As will be appreciated by those skilled in the art, the electromechanical valve depicted in FIG. 23 is only one of many such valves which may incorporate applicant's novel structure. Other such valve designs which may be modified to incorporate applicants' structure include, e.g., the electromechanical valves U.S. Pat. Nos. 5,094,264, 5,074,379, 5,027,846, 4,986,445, 4,997,978, 4,974,636, 4,967,781, 4,945,943, 4,907,680, 4,903,119, 4,779,582, 4,393,921, 3,800,201and the like. The disclosure of each of these United States patents is hereby incorporated by reference into this specification.

In the preferred embodiment depicted in FIG. 23, the valve 319 is comprised of a hydraulic housing 320 into which hydraulic fluid (not shown) is introduced via ports 322 and 324. Disposed within housing 320 is magnet 326 which cooperates in effecting the movement of assembly 328 in the direction of arrows 330 and 332.

A circuit board 334 comprised of a current controlling device 336 produces an electromagnetic field in coils 338 and 340 which inductively couples to the coils 342 which are formed in accordance with the procedure of Example 1.

In the embodiment depicted, a layer 350 of "TEFLON" and nickel plated together (composite) is produced over the copper to facilitate sliding motion.

When the flow channels 351 and 353 register with the channels formed between the copper and Teflon plated patterns, fluid is allowed to flow. Thus, fluid flow can be controlled by the power fed to the circuit.

A Resistor Network

Figure 24:
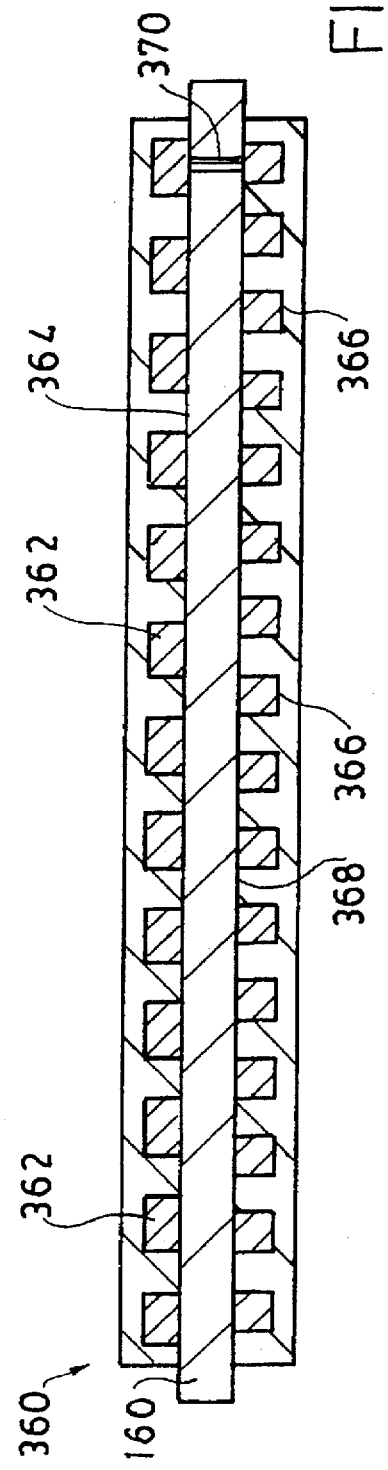
FIG. 24 is a sectional view of a resistor network made in accordance with applicants' process.

By way of further illustration, a resistor network may be prepared in substantial accordance with the procedure of Example 1 and FIG. 24.

In the preferred embodiment depicted in FIG. 24, the resistor network 360 is comprised of a substrate 160, a first continuous layer of metal 362 disposed on the top surface 364 of substrate 160, and a second continuous layer of metal 366 disposed on the bottom surface 368 of substrate 160. Connection between resistor 362 and resistor 366 may be made by means of, e.g., via 370.

It will be apparent to those skilled in the art that many other resistor networks, connected in series and/or parallel and disposed on one or more layers of substrate 160 and/or dielectric (not shown), may also be used.

A Stacked Transformer Assembly

Figure 25:
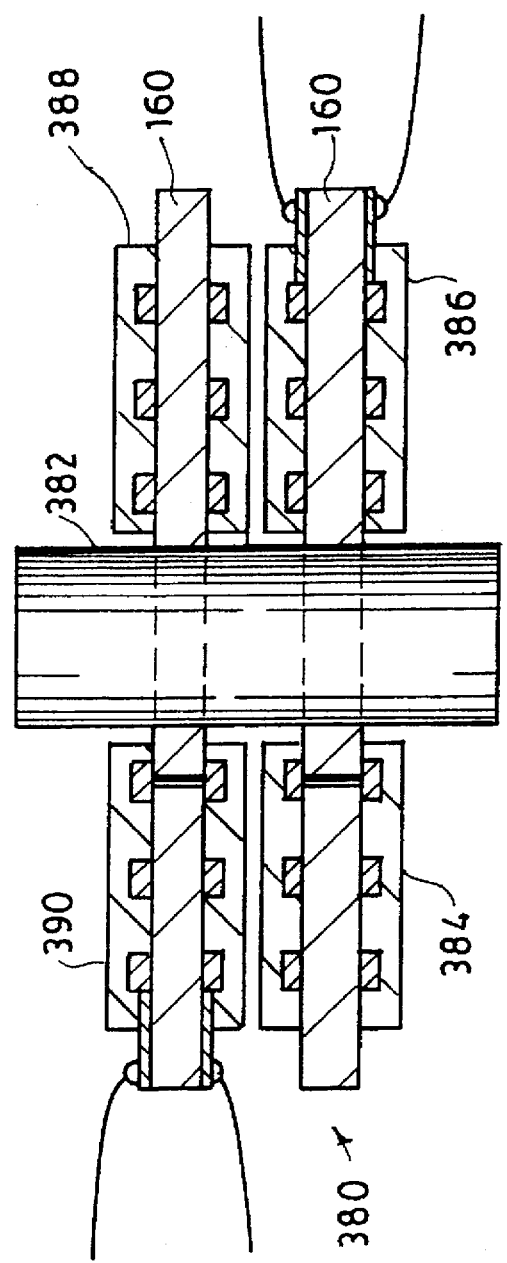
FIG. 25 is a sectional view of a stacked planar transformer made in accordance with applicants' process.

By way of further illustration, a stacked planar transformer may be prepared in substantial accordance with the procedure of Example 1 and FIG. 25.

As will be appreciated by those skilled in the art, the stacked planar transformer depicted in FIG. 25 is only one of many such planar transformers which may incorporate applicant's novel structure. Other such transformer designs which may be modified to incorporate applicants' structure include, e.g., the transformers disclosed in U.S. Pat. Nos. 5,084,958, 5,073,766, 5,069,308, 5,017,902, 5,010,314, 4,993,140, 4,959,630, 4,953,286, 4,866,344, 4,862,129, and the like; the disclosure of each of these United States patents is hereby incorporated by reference into this specification.

In the preferred embodiment depicted in FIG. 25, the planar transformer 380 is comprised of substrates 160 and, disposed through the center of such substrates, a ferrite core 382. A second planar transformer 386, a third planar transformer 388, and a fourth planar transformer 390 are formed on substrates 160.

A Refractory Metal Multilayer Substrate

Figure 26:
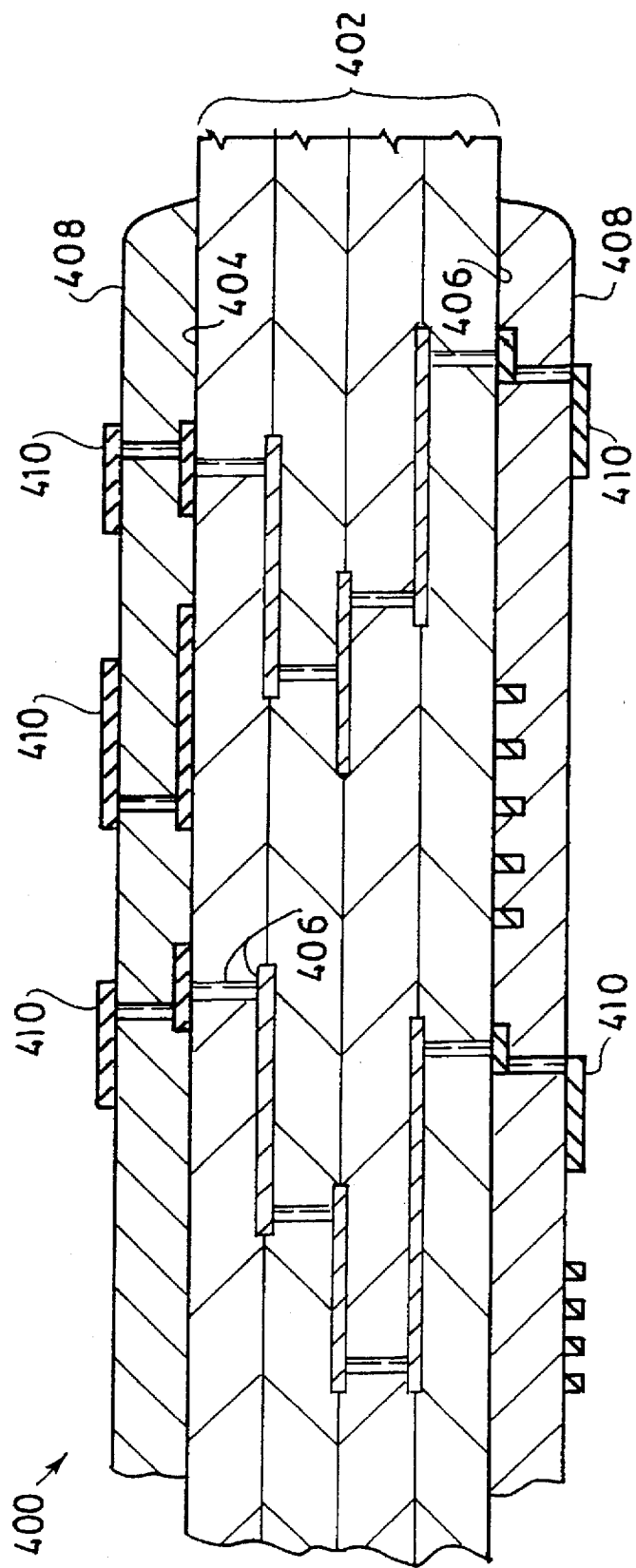
FIG. 26 is a sectional view of a refractory metal multilayer structure made in accordance with applicants' process.

By way of further illustration, a refractory metal multilayer substrate assembly 400 may be prepared in substantial accordance with the procedure of Example 1 and FIG. 26.

Referring to FIG. 26, assembly 400 is comprised of refractory metal substrate 402. These type of substrates are well known to those skilled in the art and are described, e.g., in U.S. Pat. Nos. 5,082,606, 5,049,164, 4,984,940, 4,900, 257, 4,866,009, 4,835,593, and the like. The disclosure of each of these United States patents is hereby incorporated by reference into this specification.

By way of illustration, a refractory multilayer substrate circuit 402 with a top surface 404 and a bottom surface 406 may be purchased from Kyocera America, Inc., 8611 Balboa Avenue, San Diego, Calif. 92123.

Referring again to FIG. 26, the refractory metal 406 in substrate 402 generally extends to said top surface 404 and said bottom surface 406. Thereafter, by the use of applicants' process, dielectric material 408 is applied to substrate 402, and conductive metal 410 (such as copper) is built up from substrate 402.

A Stacked Capacitor Configuration

Figure 27:
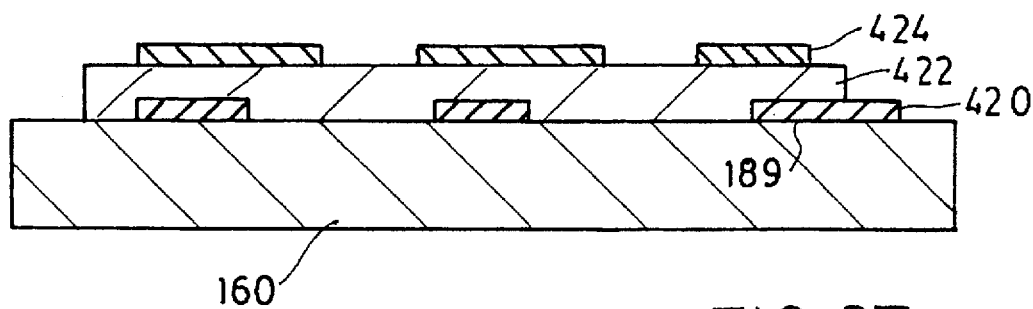
FIG. 27 is a sectional view of a capacitor made in accordance with applicants' process.

By way of further illustration, one may produce a capacitor in substantial accordance with the procedure of Example 1 and FIG. 27. Referring to FIG. 27, a first layer of conductive metal is separated by a high K dielectric material 422 (with a dielectric constant from about 500 to about 3,000) from a second layer of conductive metal 424.

Rotor for a Miniature Electric Motor

Figure 28:
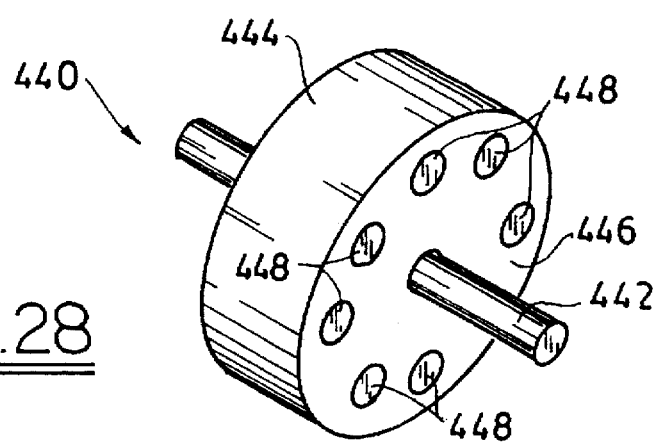
FIG. 28 is a perspective view of an electric motor made in accordance with applicants' process.

By way of further illustration, and referring to FIG. 28, a rotor 440 is comprised of a rotatable shaft 442 and, connected thereto, a rotor 444. Disposed on surface 446 of rotor 444 (and also on the opposing surface, not shown) is a multiplicity of metal coils 448 which, optionally, may contain a ferrite core. Electromagnetic fields may be selectively created in metal coils 448 which, through conventional means, can be used to cause rotor 444 to rotate.

A Metallized Graphite Substrate

Figure 29:
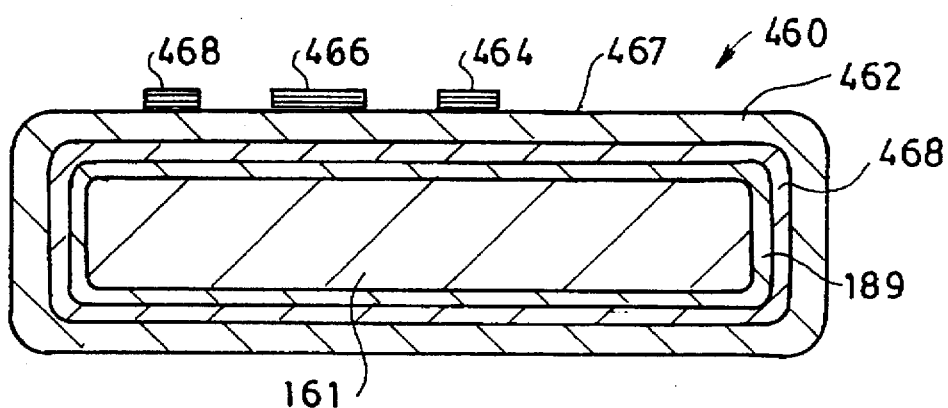
FIG. 29 is a sectional view of a metallized graphite substrate structure made in accordance with applicants' process.

By way of yet further illustration, a metallized graphite substrate can be made in substantial accordance with Example 1 and FIG. 29.

Referring to FIG. 29, graphite substrate 161 is bonded to conductive metal 189 (such as copper), intermediate dielectric layer 168, and top layer 462. Top layer 462 may be porcelainized copper, and electrical components 464, 466, and 468 can be built on top of porcelainized layers 467.

An Electrostatic Planar Motor

Figure 30A:
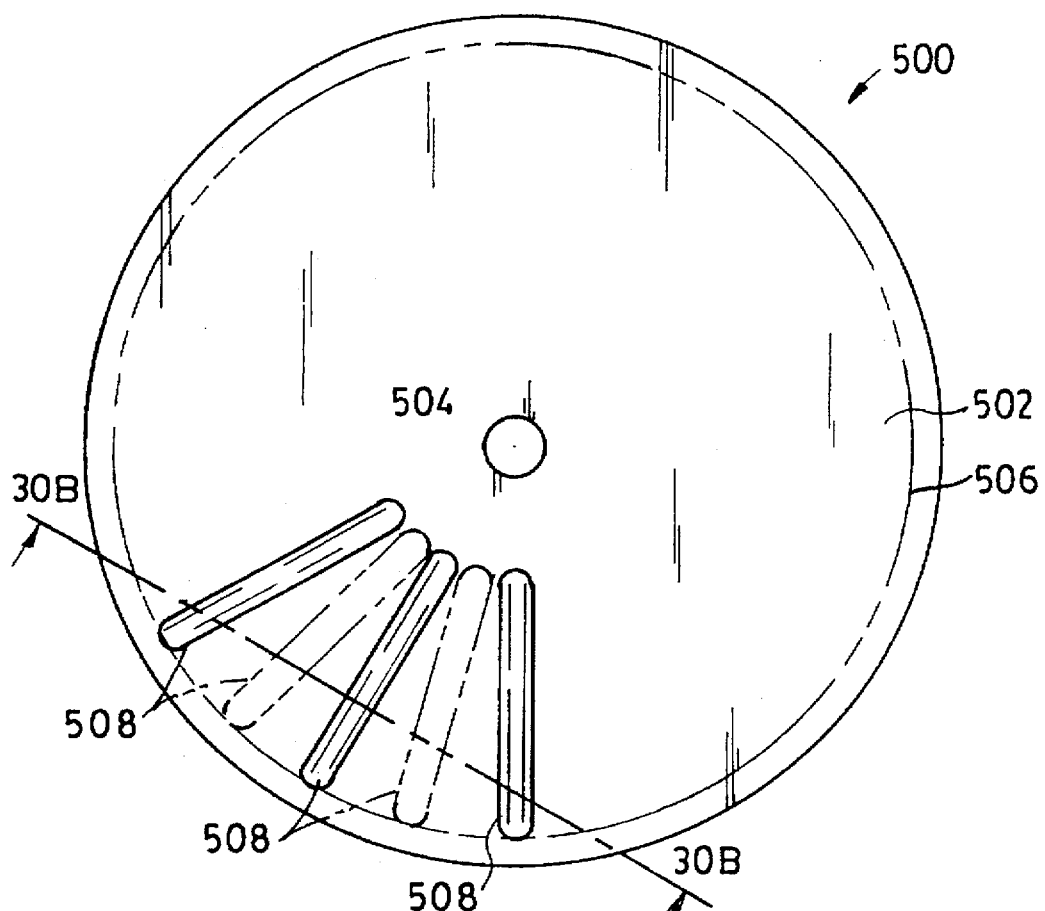
FIGS. 30A and 30B are a top and sectional view, respectively, of an electrostatic motor made in accordance with the process of the instant invention.

FIG. 30A is a top view of an electrostatic motor 500. Referring to FIG. 30A, it will be seen that motor 500 is comprised of a rotor 502 rotatably mounted on a shaft 504. Disposed beneath rotor 502 is another rotor (shown by dotted line outline 506) which is also mounted on shaft 504. It will be apparent to those skilled in the art that a multiplicity of such rotors can be mounted on one or more shafts.

In the preferred embodiment illustrated, each of rotors 502 and 506 is a substantially planar structure comprised of a dielectric material onto which has been deposited conductive metal field-producing elements 508. In the preferred embodiment illustrated in FIG. 30A, elements 508 are preferably solid bars of copper. In another embodiment, not shown, elements 508 may be in the shape of a coil.

Each of elements 508 is preferably connected to a source of electrical power and switching means so that, when power flows through any one or more of such elements, an electrostatic field is created in it. Depending upon the intensity and polarity of the field created, elements 508 in rotor 502 will either be attracted to or repelled by the elements 508 in rotor 506. Thus, by appropriate switching of electrical currents to the appropriate elements 508 in adjacent rotors 502 and 506, such rotors may be caused to rotate.

Additionally, or alternatively, one may create electromagnetic fields in elements 502 and 506 by conventional means.

It will be apparent to those skilled in the art that each of rotors 502 and 506 may be multilayer structures made by the process of this invention. In this embodiment, one advantage is the superior electrical conductivity obtainable with such structures and the microminiaturiziation of such structures. When copper or its alloys are used, a conductivity of near theoretical bulk resistivity is achieved.

Figure 30B:
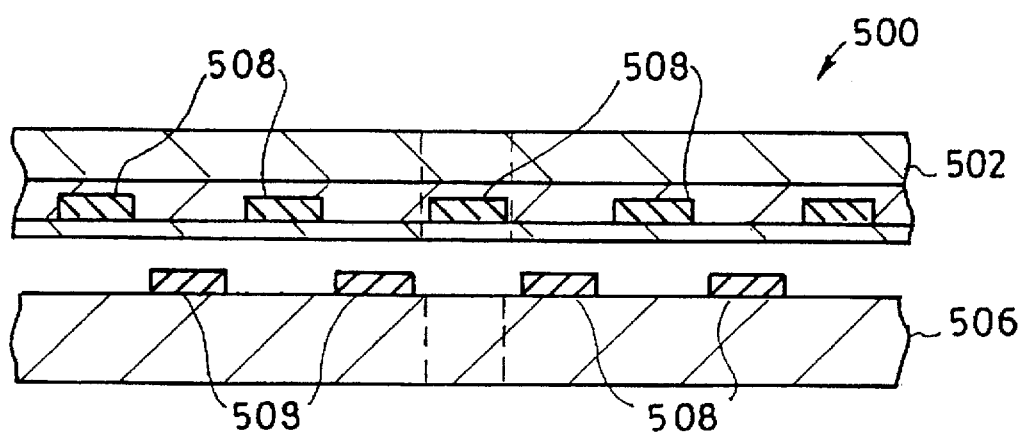

FIG. 30B is a sectional view taken through lined 30B—30B.

As will be apparent to those skilled in the art, the motor of FIGS. 30A and 30B may be used in magnetic disk drives, in optical disk drives, a linear induction motor, and the like. As will also be apparent to those skilled in the art, applicants' process may be used to make the field-producing elements used in other electrostatic motors such as in, e.g., the electrostatic motors disclosed in U.S. Pat. Nos. 5,262,695, 5,237,234, 5,235,225, 5,013,954, 4,754,185, 4,546,292, 4,225,801, 3,951,000, 3,629,624, 3,535,941, and the like. The disclosure of each of these United States patents is hereby incorporated by reference into this specification.

Figure 31:
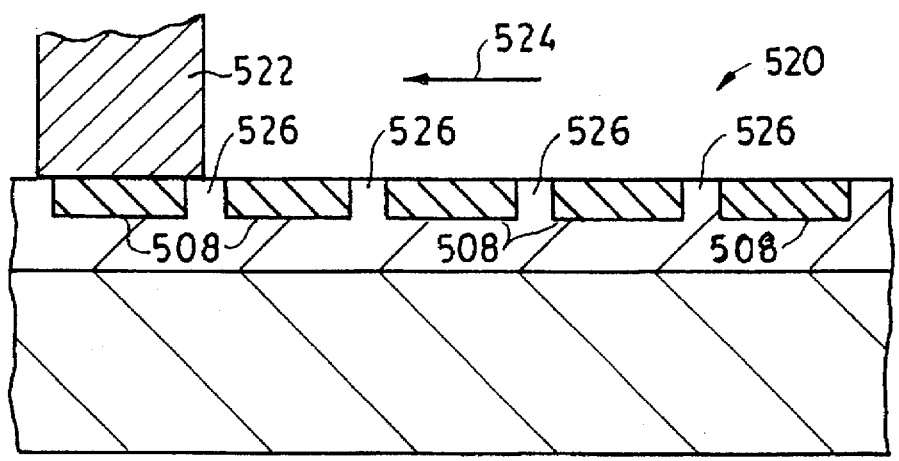
FIG. 31 is a sectional view of a commutator made in accordance with the process of this invention.

FIG. 31 is a sectional view of a commutator 520 which, in the preferred embodiment illustrated, is comprised of a brush in contact with element 508. For the sake of simplicity, in FIG. 31, only one brush 522 is shown in contact with one element 508. As will be apparent to those skilled in the art, a multiplicity of brushes 522 may be used. Alternatively, or additionally, commutator 520 may move in relation to brush 522, such as in the direction of arrow 524, so that brush 522 sequentially contacts adjacent element(s) 508.

Because of the high electrical conductivity of applicants' multilayer commutator device, and because the brush 522 contacts ceramic portions 526 of commutator 520, increased reliability and service life are obtained for this device. Similar results are obtained with other commutator designs which utilize a ceramic substrate and metal conductive elements 508 such as, e.g., the commutator disclosed in U.S. Pat. No. 4,845,395, the entire disclosure of which is hereby incorporated by reference into this specification.

Process for Preparing a High-Density Co-Fired Structure

In the process illustrated in FIGS. 32 to 37, a high density co-fired structure is produced.

Figure 32:
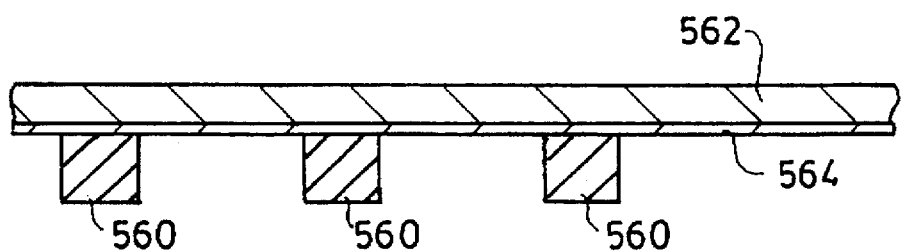
FIGS. 32–37 are sectional views of various cofireable structures which illustrate a process in which a high-definition electroformed metal pattern is transferred into a cofired structure.

In the first step of this process, illustrated in FIG. 32, a pattern of conductive metal elements 560 is formed on a carrier 562 by conventional means.

Carrier 562 may be a plastic carrier, a stainless steel carrier, a copper carrier, and the like. It is preferred that carrier 562 be reusable. In one embodiment, carrier 562 is a stainless steel device from which the deposited structure may be removed.

In one embodiment, onto carrier 562 is deposited a layer of conductive metal 564. When the carrier 562 is electrically conductive, then the deposition of layer 564 may be omitted. Thus, e.g., when carrier 562 is stainless steel, layer 564 need not be used.

When layer 564 is used, it may be deposited by conventional means such as, e. g., electroless deposition.

Elements 560 may be deposited onto layer 564 or layer 562 by conventional means such as, e.g. electroforming into selected areas defined by, e.g., photoresistive material.

Figure 33:
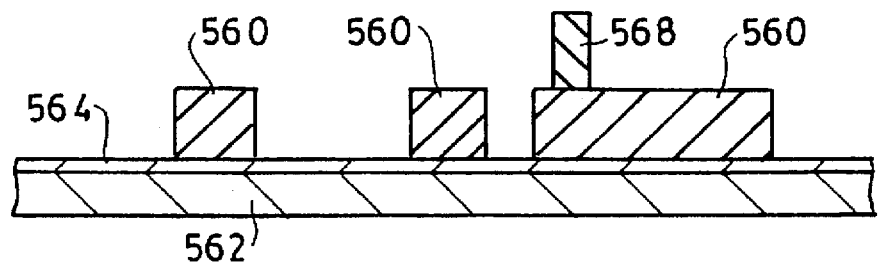
Figure 34:
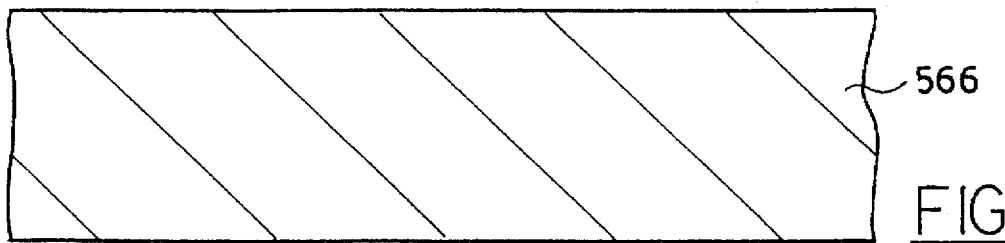

FIG. 33 is a structure similar to that of FIG. 32 which, after its production, is disposed on the other side of ceramic green body 566 (see FIG. 34). Note that, in this embodiment, one of the elements 560 is comprised of a projection 568 which, after it is pressed into the green body 566, communicates with the opposing element 560 to form a continuous electrical path from the top the bottom of the structure.

Green body 566, illustrated in FIG. 34, may be consist of or be comprised of any ceramic material (or precursor material which forms ceramic upon firing) such as, e.g., alumina, cordierite, and the like.

Figure 35:
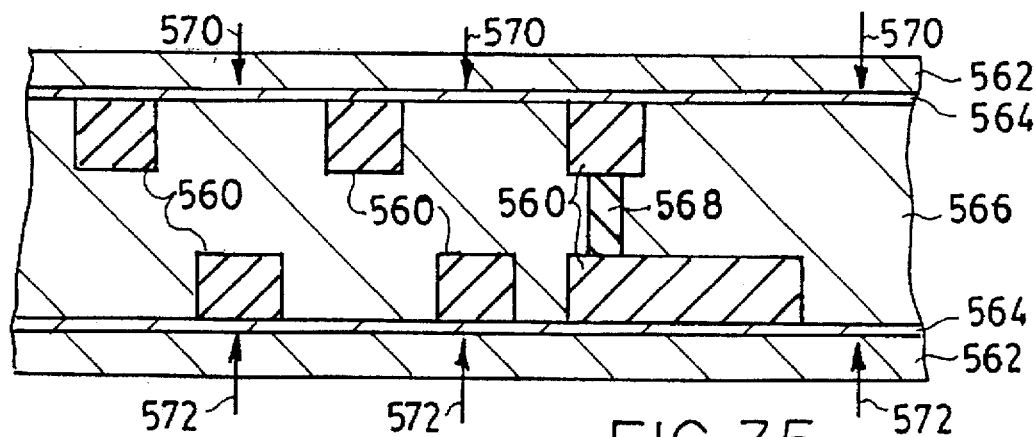
Figure 36:
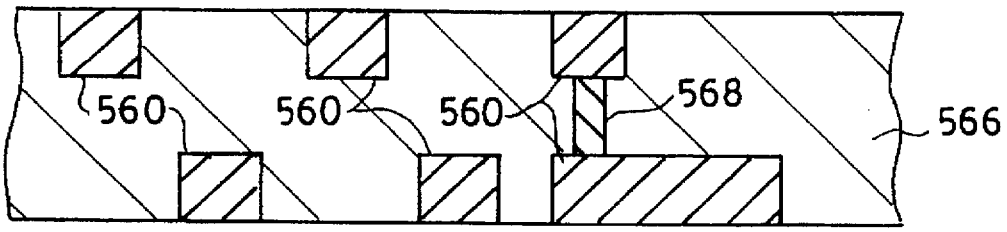

In the embodiment illustrated in FIG. 35, the respective conductive structures have been pressed in the directions of arrows 570 and 572 into green body 566.

It is preferred to remove carrier 562 prior to firing the structure. Because of a difference in controlled adhesion, this can be accomplished by the application of a lifting force (not shown).

The composite body is then preferably fired to effect sintering. Thereafter, as illustrated in FIG. 32E, layers 564 may be removed by etching.

Figure 37:
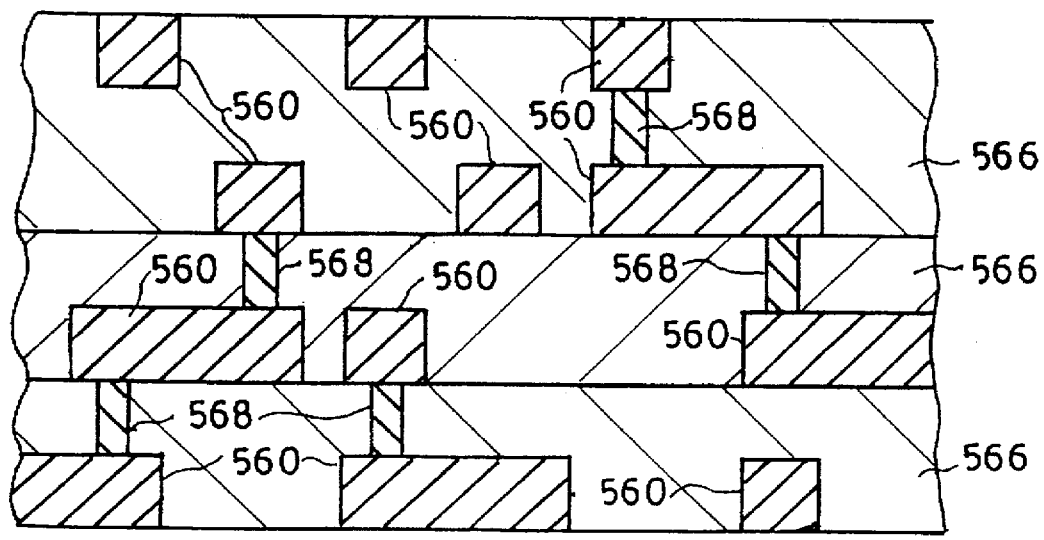

FIG. 37 shows several stacked green structures produced from substrates in which the carrier 562 is stainless steel and no layer 564 is produced. As will be apparent to those skilled in the art, these green structures can be stacked one on the other and cofired.

It is to be understood that the aforementioned description is illustrative only and that changes can be made in the apparatus, in the ingredients and their proportions, and in the sequence of combinations and process steps, as well as in other aspects of the invention discussed herein, without departing from the scope of the invention as defined in the following claims.

We claim:

1. A stacked planar transformer, which comprises:
   (a) a first workpiece having a first working surface unitary with said first workpiece,
   (b) a first layer of electrically conductive metal on said first working surface, and a heterogeneous juncture band between said first workpiece and said first conductive metal layer, substantially coextensive with said conductive metal layer and said working surface, wherein:
      1. said heterogeneous juncture band consists essentially of grains unitary with said first workpiece and conductive metal unitary with said conductive metal layer and is constituted by finger-like metal protuberances unitary with the metal layer and occupying the space between said grains, and wherein said metallized substrate is capable of withstanding repeated firing cycles at a temperature in excess of 400 degrees centigrade without separation of the metal layer from the working surface of the workpiece, and
      2. said layer of electrically conductive metal has a thickness of from about 10 to about 250 microns,
   (c) a first layer of dielectric material disposed above said first layer of conductive metal;
   (d) a second layer of conductive metal disposed on said first layer of dielectric material, wherein said second layer of conductive metal defines a continuously coiled arcuate shape with a substantially circular cross-section;
   (e) a second workpiece having a second working surface unitary with said second workpiece, wherein said second workpiece is disposed below said first workpiece;

(f) a third layer of electrically conductive metal on said second working surface, and a heterogeneous juncture band between said second workpiece and said third conductive metal layer, substantially coextensive with said conductive metal layer and said second working surface, wherein:
1. said heterogeneous juncture band consists essentially of grains unitary with said second workpiece and conductive metal unitary with said conductive metal layer and is constituted by finger-like metal protuberances unitary with the metal layer and occupying the space between said grains, and wherein said metallized substrate is capable of withstanding repeated firing cycles at a temperature in excess of 400 degrees centigrade without separation of the metal layer from the working surface of the second workpiece, and 2. said third layer of electrically conductive metal has a thickness of from about 10 to about 250 microns, (g) a second layer of dielectric material disposed above said third layer of conductive metal;

(h) a fourth layer of conductive metal disposed on said second layer of dielectric material, wherein said second layer of conductive metal defines a continuously coiled arcuate shape with a substantially circular cross-section;

(i) a first ferrite core extending through said first workpiece; and (j) a second ferrite core extendinq through said second workpiece, wherein said second ferrite core is contiguous with said first ferrite core.

* * * * *